(12) United States Patent
Park et al.

(10) Patent No.: US 11,043,511 B2
(45) Date of Patent: Jun. 22, 2021

(54) DISPLAY APPARATUS

(71) Applicant: LG Display Co., Ltd., Seoul (KR)

(72) Inventors: Heonkwang Park, Paju-si (KR);
Jongchan Park, Paju-si (KR);
Hyunchul Um, Paju-si (KR); Taewon Lee, Wonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/511,886

(22) Filed: Jul. 15, 2019

(65) Prior Publication Data

US 2020/0194461 A1 Jun. 18, 2020

(30) Foreign Application Priority Data

Dec. 17, 2018 (KR) ........................ 10-2018-0163104

(51) Int. Cl.
| | |
|---|---|
| *H01L 27/12* | (2006.01) |
| *G09G 3/20* | (2006.01) |
| *H01L 27/32* | (2006.01) |

(52) U.S. Cl.
CPC ............ *H01L 27/124* (2013.01); *G09G 3/20* (2013.01); *H01L 27/1218* (2013.01); *H01L 27/1255* (2013.01); *G09G 2300/0413* (2013.01); *G09G 2300/0823* (2013.01); *G09G 2300/0871* (2013.01); *G09G 2320/0233* (2013.01); *H01L 27/3262* (2013.01); *H01L 27/3265* (2013.01); *H01L 27/3276* (2013.01)

(58) Field of Classification Search
CPC .............. G09G 3/20; G09G 2300/0413; H01L 27/1218; H01L 27/124; H01L 27/1255
See application file for complete search history.

(56) References Cited

U.S. PATENT DOCUMENTS

| | | | | |
|---|---|---|---|---|
| 10,636,859 | B2 * | 4/2020 | Park ...................... | G09G 3/3233 |
| 2017/0249896 | A1 * | 8/2017 | Kim ...................... | H01L 27/124 |
| 2018/0005585 | A1 * | 1/2018 | Kim ...................... | H01L 27/3223 |
| 2018/0090061 | A1 * | 3/2018 | Kim ......................... | H01L 29/40 |
| 2018/0342572 | A1 * | 11/2018 | Park ..................... | H01L 27/3246 |

FOREIGN PATENT DOCUMENTS

KR 10-2018-0032722 A 4/2018

* cited by examiner

*Primary Examiner* — Allan R Wilson
(74) *Attorney, Agent, or Firm* — Fenwick & West LLP

(57) ABSTRACT

Provided is a display apparatus. The display apparatus includes an active area and a bezel area, the display apparatus comprising semiconductor patterns disposed in a third area of the bezel area, an insulating layer disposed on the semiconductor patterns and includes contact holes and dummy holes, a power supply electrode disposed in the third area of the bezel area, overlaps the semiconductor patterns with the insulating layer therebetween, and is connected to the semiconductor patterns through the contact holes, dummy gate lines disposed between the semiconductor patterns and the power supply electrode, overlap the semiconductor pattern to form a first compensation capacitance and overlap the power supply electrode to form a second compensation capacitance, and a dummy semiconductor patterns disposed in the third area of the bezel area, and are connected to the power supply electrode through the dummy holes.

23 Claims, 15 Drawing Sheets

DISPLAY APPARATUS

CROSS-REFERENCE TO RELATED APPLICATIONS

This application claims the priority benefit of Republic of Korea Patent Application No. 10-2018-0163104 filed on Dec. 17, 2018, the disclosure of which is incorporated herein by reference in its entirety.

BACKGROUND

Technical Field

The present disclosure relates to a display apparatus.

Description of the Related Art

As the information society develops, the demand for display apparatuses which display images is increasing in various forms. For example, as a substitution of a cathode ray tube (CRT) having a large volume, a display apparatus which is thin, light, and large has been rapidly developed. As such display apparatus, various display apparatus including a liquid crystal display (LCD), an electroluminescent display (EL) such as an organic light emitting display (OLED) and a quantum dot light emitting display (QLED), a field emission display (FED), and an electrophoretic display (ED) have been developed and utilized.

The display apparatuses include a display panel including display elements for displaying information, a driving unit for driving the display panel, a power supply unit which generates power to be supplied to the display panel and the driving unit, and the like.

The display apparatuses may be designed to have various designs depending on a usage environment or purposes and thus the display panel which displays images is correspondingly changed to have various shapes from a typical single rectangular shape to a circular shape and an elliptical shape as well as a shape having a free form portion such as a partial curved surface or a notch.

The display apparatus formed of a display panel which has a free form portion or is implemented to have a circular shape or an elliptical shape may increase a degree of freedom of a product design so that it may be advantageously appealed to consumers who emphasize a design aspect.

However, the number of pixels disposed in every line (for example, a horizontal line) of a free form portion of the display panel with a curved surface or a notch may be different from the number of pixels in every line of a non-free form portion of the display panel. Further, a variation of a resistor-capacitor load (R-C load) is caused due to the difference of the number of pixels disposed in every line of the free form portion and the non-free form portion so that signal delay between lines may be generated. Therefore, the luminance nonuniformity of the display panel may be caused and the display quality may be degraded.

SUMMARY

An object of the present disclosure is to provide a display apparatus which compensates an R-C load of a free form portion depending on an R-C load difference due to the difference of the number of pixels in a region of the display panel including a free form portion and a region which does not include the free form portion, thereby improving the luminance nonuniformity.

According to an aspect of the present disclosure, a display apparatus which includes an active area including a first area having a free form portion and a second area which does not have a free form portion and a bezel area including a third area which is adjacent to the first area and has a free form portion and a fourth area which is adjacent to the second area and does not have a free form portion includes: a plurality of semiconductor patterns disposed in the third area of the bezel area, a power supply electrode which is disposed in the third area of the bezel area, overlaps the semiconductor patterns with the insulating layer therebetween, and is connected to the plurality of semiconductor patterns through a plurality of contact holes of the insulating layer, a plurality of dummy gate lines which is disposed between the semiconductor patterns and the power supply electrode, overlaps the semiconductor pattern to form a first compensation capacitance and overlaps the power supply electrode to form a second compensation capacitance, and a plurality of dummy semiconductor patterns which is disposed in the third area of the bezel area adjacent to a curved portion having a round shape in the first area of the active area and have a smaller area than that of the plurality of semiconductor patterns, and is connected to the power supply electrode through the plurality of dummy holes of the insulting layer.

According to another aspect of the present disclosure, a display apparatus includes: a substrate including an active area which includes a curved portion having a round shape, a notch portion in which one side is removed, and first and second sub active areas which display a screen and is divided to the left and the right by the notch portion and a bezel area disposed to be adjacent to the active area, a plurality of semiconductor patterns of a compensating unit disposed in the bezel area located between the first sub active area and the second sub active area, a plurality of first dummy semiconductor patterns of a first dummy contact unit disposed between the first sub active area and the compensating unit and a plurality of second dummy semiconductor patterns of a second dummy contact unit disposed between the second sub active area and the compensating unit, the plurality of first dummy semiconductor patterns and the plurality of second dummy semiconductor patterns being disposed in the bezel area adjacent to the curved portion, a power supply line which overlaps the plurality of semiconductor patterns, the plurality of first dummy semiconductor patterns, and the plurality of second dummy semiconductor patterns with an insulating layer therebetween, and a first dummy gate line and a second dummy gate line which overlap the plurality of semiconductor patterns and the power supply line and do not overlap the plurality of first dummy semiconductor patterns and the plurality of second dummy semiconductor patterns.

According to another aspect of the present disclosure, a display apparatus includes a substrate including an active area including a first area having a free form portion and a second area which does not have a free form portion and a bezel area including a third area which is adjacent to the first area and has a free form portion and a fourth area which is adjacent to the second area and does not have a free form portion, a plurality of semiconductor patterns which is located on the substrate and is disposed in the third area of the bezel area, a plurality of dummy semiconductor patterns which is disposed on the same layer as the plurality of semiconductor patterns and has a smaller area than that of the plurality of semiconductor patterns, a gate insulating layer on the plurality of semiconductor patterns and the plurality of dummy semiconductor patterns, a first interlayer insulating layer on the gate insulating layer, a plurality of dummy gate lines on the first interlayer insulating layer, a second interlayer insulating layer which is disposed on the first interlayer insulating layer and covers the plurality of dummy gate lines, and a power supply line which is disposed on the second interlayer insulating layer and overlaps the plurality of dummy gate lines to form a first compensation capacitance.

According to the display apparatus of the present disclosure, at least one compensating unit is disposed in a bezel area of the display panel having a free form portion to increase an R-C load for every gate line, which may be compensated to be close to the R-C load for every gate line of the non-free form portion. Therefore, it is possible to improve the luminance nonuniformity of the display panel.

According to the display apparatus of the present disclosure, in order to compensate the luminance nonuniformity generated in the free form portion of the display panel, a compensating unit may be disposed in a bezel area corresponding to the free form portion. Further, a contact hole may be disposed in the compensating unit to ensure the capacitance. The inventor of the present disclosure confirmed that when the contact hole is formed only in a specific area of the bezel area where the compensating unit is disposed, a time to charge the voltage for every pixel of the active area varies. Further, it is confirmed that since the time to charge the voltage in every pixel varies, the luminance nonuniformity is generated in the free form portion of the active area. The inventor of the present disclosure found out that the luminance of the pixel is affected by the density of the contact hole disposed in the bezel area. Further, it is confirmed that the luminance nonuniformity is also easily generated at a curved surface having a round shape in the active area. Therefore, in the display apparatus of the present disclosure, a dummy hole is formed in a bezel area adjacent to the curved surface of the active area to improve the luminance nonuniformity of the display panel caused by a density nonuniformity of the hole.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
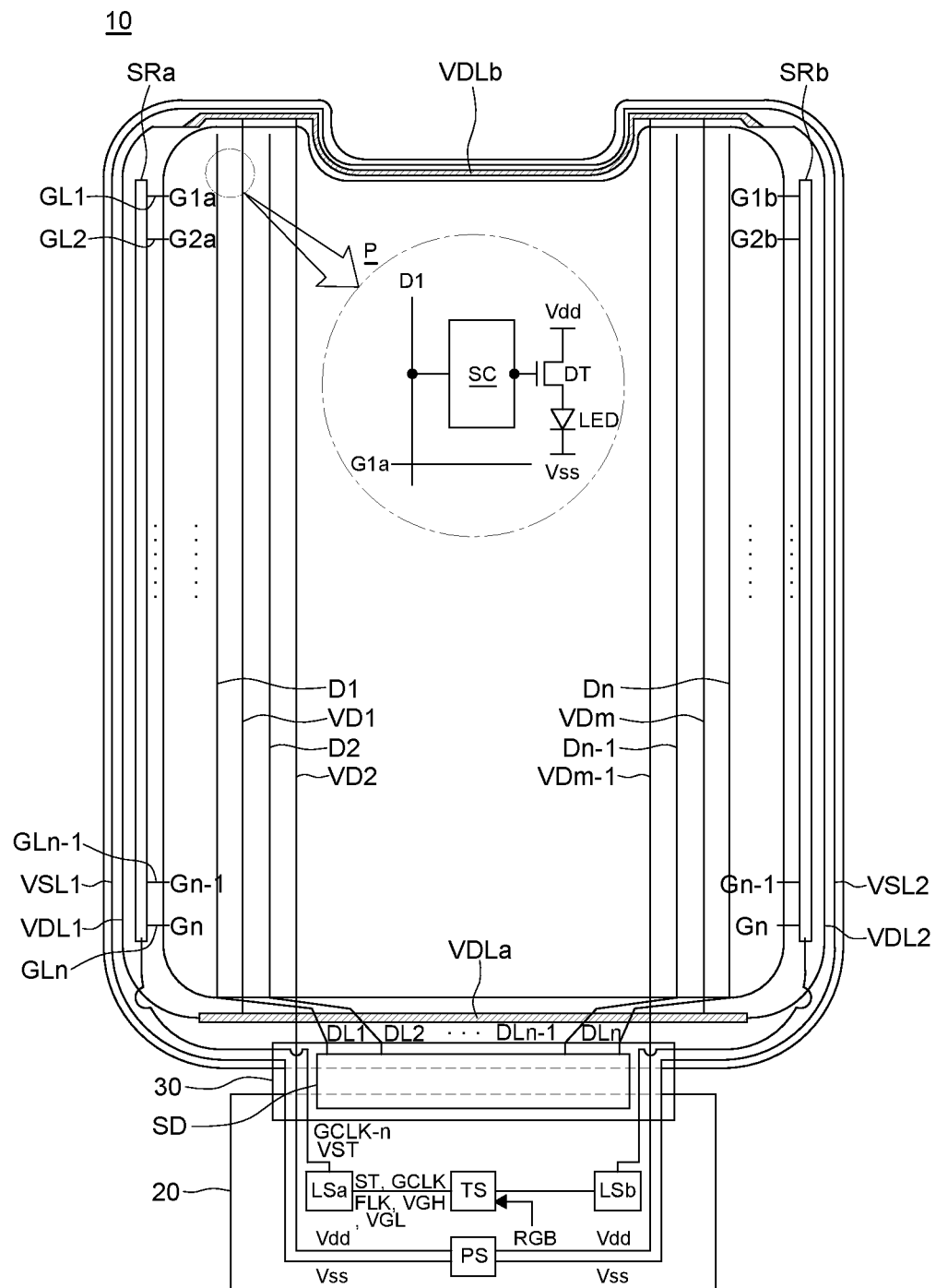
FIG. 1 is a block diagram illustrating a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display apparatus according to an exemplary embodiment of the present disclosure will be described with reference to FIGS. 1 to 3.

Figure 2:
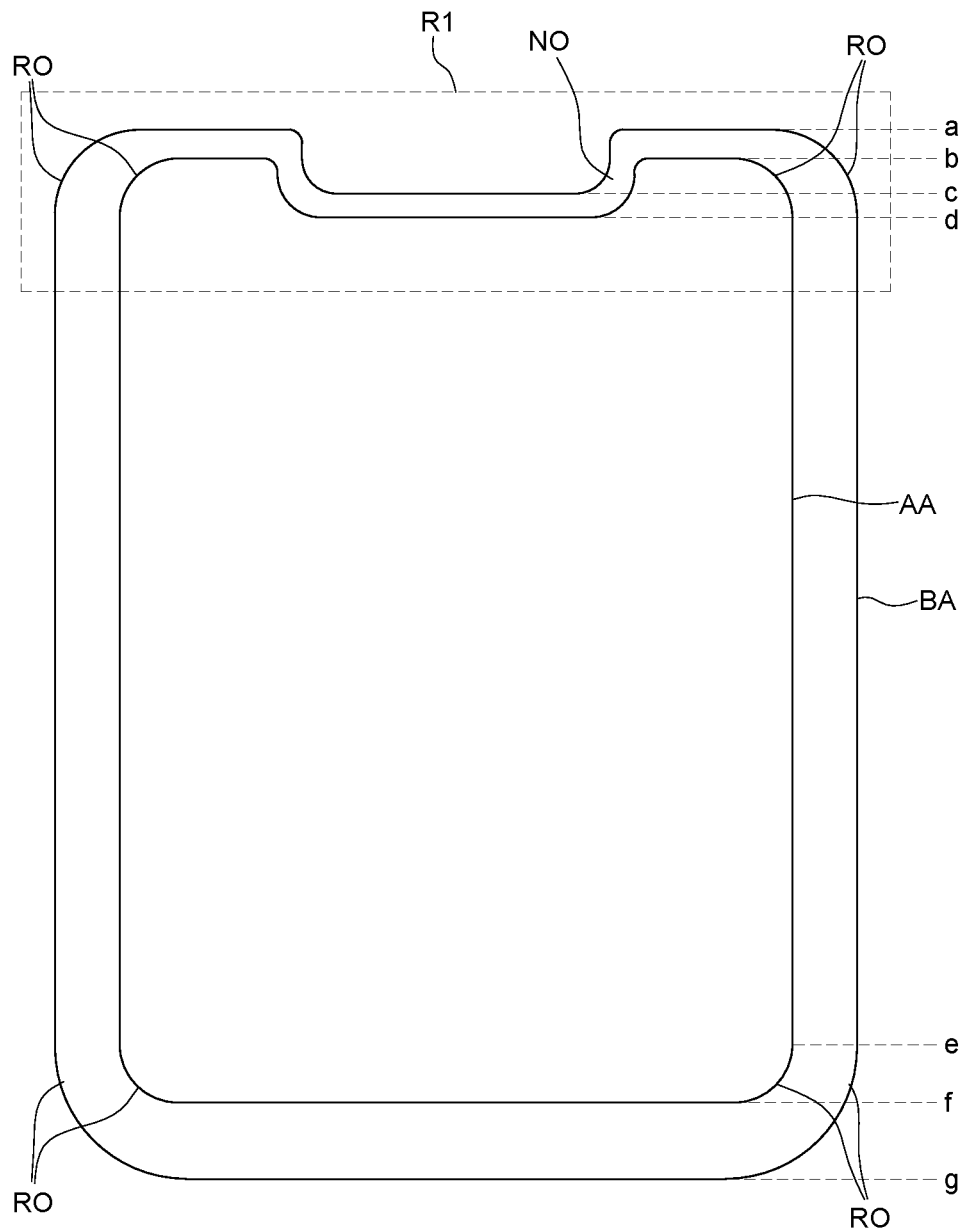
FIG. 2 is a plan view schematically illustrating a shape of a display panel illustrated in FIG. 1 according to an exemplary embodiment of the present disclosure.
Figure 3:
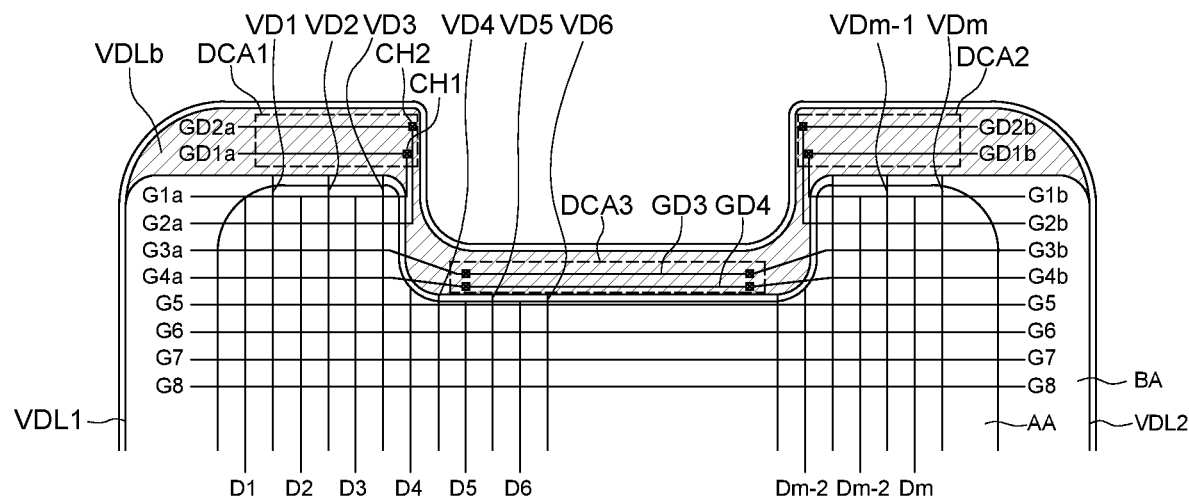
FIG. 3 is a plan view illustrating R1 illustrated in FIG. 2 according to an exemplary embodiment of the present disclosure.

FIG. 1 is a block diagram illustrating a display apparatus according to an exemplary embodiment of the present disclosure, FIG. 2 is a plan view schematically illustrating a shape of a display panel illustrated in FIG. 1, and FIG. 3 is a plan view illustrating a partial area R1 of a display panel illustrated in FIG. 2.

Referring to FIG. 1, a display apparatus according to an exemplary embodiment of the present disclosure may include a display panel 10, a data driving unit, a GIP (gate in panel) type gate driving unit, a power supply unit PS, and a timing controller TS.

The display panel 10 may include an active area AA which displays information, and a bezel area BA in which information is not displayed.

The active area AA is an area where input images are displayed and a plurality of pixels P are disposed in a matrix.

The bezel area BA may be an area, where shift registers SRa and SRb of a gate driving circuit, gate link signal lines GL1 to GLn, data link signal lines DL1 to DLn, first link power supply lines VDL1 and VDL2, second link power supply lines VSL1 and VSL2, and power supply electrodes VDLa and VDLb (also referred to as power supply lines VDLa and VDLb) are disposed. In the active area AA, a plurality of data lines D1 to Dn and a plurality of gate lines G1 to Gn are disposed to intersect each other and pixels P are disposed in a matrix at every intersection.

Each pixel P includes a light emitting diode LED, a driving thin film transistor DT (hereinafter, referred to as a driving TFT) which controls a current amount flowing into the light emitting diode LED, and a programming unit SC for setting a gate-source voltage of the driving TFT (DT). The pixels P of the display panel 10 may be supplied with a first power source Vdd which is a high potential voltage through first power source lines VD1 to VDm and a second power source Vss which is a low potential voltage through second link power supply lines VSL1 and VSL2, from the power supply unit PS.

The first power source lines VD1 to VDm may be supplied with the first power source Vdd from the power supply unit PS through both a lower side first power supply electrode VDLa disposed in the bezel area BA on the side to which the chip-on film 30 is attached and an upper side first power supply electrode VDLb disposed in an opposite bezel area. Both ends of the lower side first power supply electrode VDLa and the upper side first power supply electrode VDLb may be connected to each other by first link power supply lines VDL1 and VDL2. However, the present disclosure is not limited thereto and the lower side first power supply electrode VDLa and the upper side first power supply electrode VDLb may be connected to each other by the first power source lines VD1 to VDm without forming the first link power supply lines VDL1 and VDL2 which connect the both ends to each other. Therefore, it is possible to minimize the degradation of the display quality due to the increased RC in accordance with the position of the pixels disposed in the active area AA.

The programming unit SC may include at least one switching TFT and at least one storage capacitor. The switching TFT is turned on in response to a scan signal from the gate lines G1 to Gn to apply a data voltage from the data lines D1 to Dn to one electrode of the storage capacitor. The driving TFT (DT) may control a current amount supplied to the light emitting diode LED in accordance with a magnitude of the voltage charged in the storage capacitor to control an emission amount of the light emitting diode LED. The emission amount of the light emitting diode LED may be proportional to a current amount supplied from the driving TFT (DT).

TFTs which configure the pixel P may be implemented as a p type or an n type. Further, a semiconductor layer of TFTs which configure the pixel P may include at least one of amorphous silicon, polysilicon, and an oxide semiconductor material. The light emitting diode LED may include an anode electrode, a cathode electrode, and an emission structure interposed between the anode electrode and the cathode electrode. The anode electrode may be connected to the driving TFT (DT). The emission structure may include an emission layer (EML) and a hole injection layer (HIL) and a hole transport layer (HTL) may be disposed at one side of the emission layer and an electron transport layer (ETL) and an electron injection layer (EIL) may be disposed at the other side, with the emission layer therebetween.

In the data driving unit, a data IC (SD) may be mounted. One side of the data IC may be connected to one end of the source printed circuit board 20.

The data IC (SD) may convert digital video data input from the timing controller TS into an analog gamma compensation voltage to generate a data voltage. The data voltage output from the data IC (SD) may be supplied to the data lines D1 to Dn.

The GIP type gate driving unit may include level shifters LSa and LSb mounted on the source printed circuit board 20 and shift registers SRa and SRb which are formed in the bezel area BA of the display panel 10 to receive signals supplied from the level shifters LSa and LSb.

The level shifters LSa and LSb may receive signals, such as a start pulse ST, gate shift clocks GCLK, and a flicker signal FLK, from the timing controller TS. Further, the level shifters LSa and LSb may be supplied with a driving voltage such as a gate high voltage VGH and a gate low voltage VGL. The start pulse ST, the gate shift clocks GCLK, and the flicker signal FLK may swing between about 0 V and about 3.3 V. The gate shift clocks GCLK1 to GCLKn may be n-phase clock signals having a predetermined phase difference. The gate high voltage VGH is a voltage higher than a threshold voltage of a thin film transistor TFT formed in a thin film transistor array of the display panel 10 and may be approximately 28 V. The gate low voltage VGL is a voltage lower than a threshold voltage of the thin film transistor TFT formed in a thin film transistor array of the display panel 10 and may be approximately −5 V, but is not limited thereto.

The level shifters LSa and LSb may output shift clock signals CLKs obtained by shifting the levels of the start pulse ST and the gate shift clocks GCLK input from the timing controller TS to the gate high voltage VGH and the gate low voltage VGL. Therefore, each of the start pulse VST and the shift clock signals CLK output from the level shifters LSa and LSb may swing between the gate high voltage VGH and the gate low voltage VGL. The level shifters LSa and LSb may lower the gate high voltage in accordance with the flicker signal FLK to lower a kickback voltage ΔVp of the liquid crystal cell, thereby reducing the flicker.

Output signals of the level shifters LSa and LSb may be supplied to the shift registers SRa and SRb through lines formed on the chip-on film 30 on which the data IC (also referred to as source drive IC) (SD) is disposed and line-on-glass LOG lines formed on the substrate of the display panel 10. The shift registers SRa and SRb may be directly formed on the bezel area BA of the display panel 10 by the GIP process.

The shift registers SRa and SRb may shift the start pulse VST input from the level shifters LSa and LSb in accordance with the gate shift clock signals CLK1 to CLKn to sequentially generate the gate pulses swinging between the gate high voltage and the gate low voltage VGL. The gate pulses output from the shift registers SRa and SRb are sequentially supplied to the gate lines G1 to Gn.

The timing controller TS receives timing signals such as a vertical synchronization signal, a horizontal synchronization signal, a data enable signal, and a main clock input from the host system to synchronize operating timings of the data IC (SD) and gate driving units LSa, LSb, SRa, and SRb. A data timing control signal for controlling the data IC (SD) may include a source sampling clock SSC and a source output enable signal SOE. The gate timing control signal for controlling the gate driving units LSa, LSb, SRa, and SRb may include a gate start pulse GSP, a gate shift clock GSC, and a gate output enable signal GOE.

In FIG. 1, it is illustrated that the shift registers SRa and SRb are disposed on both sides at the outside of the active area AA to supply the gate pulse to the gate lines G1 to Gn at both ends of the active area AA, but the present disclosure is not limited thereto. Therefore, the shift register may be disposed only at one side of the active area AA to supply the gate pulse to the gate lines G1 to Gn at one side of the active area AA. When the shift registers SRa and SRb are disposed on both sides of the outside of the active area AA, a gate pulse having the same phase and the same amplitude may be supplied to the pixels P disposed on the same horizontal line through the gate line.

Referring to FIG. 2, the display panel 10 according to the present disclosure may include the active area AA and the bezel area BA located adjacent to the active area AA.

The active area AA is an area, where the pixels P are disposed, and includes a first area (an area from a line b to a line d, and an area from a line e to a line f) having a free form portion and a second area (an area from the line d to the line e) which does not have a free form portion. The first area having the free form portion may include a 1a-th area which is an area from the line b to the line d and a 1b-th area which is an area from the line e to the line f. For example, as illustrated in FIG. 2, in the first area having a free form portion in the display panel 10, the 1a-th area may be an area having a curved portion RO and a notch portion NO, and the 1b-th area may be an area which has only the curved portion RO.

The bezel area BA is an area which encloses the active area AA at the outside of the active area AA and includes a third area (an area from the line a to the line d, and an area from the line e to the line g) having a free form portion which is similar to the active area AA and a fourth area (an area from the line d to the line e) which does not have a free form portion. The third area having the free form portion may include a 3a-th area which is an area from the line a to the line d, and a 3b-th area which is an area from the line e to the line g. For example, as illustrated in FIG. 2, in the third area of the bezel area BA having a free form portion in the display panel 10, the 3a-th area may be an area having a curved portion RO and a notch portion NO, and the 3b-th area may be an area which has only the curved portion RO.

The free form portion may have at least one of a curved portion RO having a round shape at a corner of the display panel 10 and a notch portion NO in which a predetermined area is removed along one side of the display panel 10.

In the example of FIG. 2, it is illustrated that the free form portion has both the curved portion RO and the notch portion NO, and the notch portion NO is formed at a center of one side of the display panel 10, but the present disclosure is not limited thereto. For example, the free form portion may include only one of the curved portion and the notch portion, and the north portion may also be formed at the corner. Therefore, the example of FIG. 2 should not be construed to narrow the scope of the present disclosure.

As illustrated in FIG. 2, the active area AA may include a first area which includes a free form portion, and a second area which does not include a free form portion. The first area (an area from the line b to the line d, and an area from the line e to the line may include the 1a-th area (an area from the line b to the line d) and the 1b-th area (an area from the line e to the line f). The number of pixels P disposed on each horizontal line in the first area of the active area AA should be smaller than the number of pixels disposed on each horizontal line in the second area (an area from the line d to the line e) which does not have a free form portion. For example, as illustrated in FIG. 3, the number of pixels P corresponding to the gate lines G4a and G4b disposed in the 1a-th area of the first area may be smaller than the number of pixels P corresponding to the gate line G6 disposed in the second area. Therefore, a difference in the R-C load (resistor-capacitor load) is caused by the difference in the number of pixels, so that there may be a problem in that the luminance is not uniform. Therefore, the display quality may be degraded.

In the present disclosure, in order to solve the problem of the luminance nonuniformity, as illustrated in FIG. 3, at least one of first to third load compensating units DCA1, DCA2, and DCA3 is disposed in a third area of the bezel area BA, where the pixels are not formed, to compensate the luminance nonuniformity of the first area and the second area.

In FIG. 3, it is illustrated that first and second sub active areas are formed by dividing the 1a-th area of the active area AA to the left and the right by the notch portion NO in the display panel 10, but the present disclosure is not limited thereto. For example, the notch portion NO may be disposed in any one of the left side and the right side of the active area AA, or a plurality of notch portions may be disposed at the center portion. Therefore, the example of FIG. 3 should not be construed to narrow the scope of the present disclosure.

Referring to FIG. 3, the display panel 10 according to the present disclosure may include the active area AA and the bezel area BA. The active area AA may include a first area having a free form portion and a second area which does not have a free form portion. The first area may include a 1a-th area including a notch portion NO and a curved portion RO, and a 1b-th area including a curved portion RO. The bezel area BA is located to be adjacent to the active area AA and disposed to enclose the active area AA. The bezel area BA may include a third area having a free form portion and a fourth area which does not have a free form portion. The third area may include a 3a-th area including a notch portion NO and a curved portion RO, and a 3b-th area including a curved portion RO. The 3a-th area of the bezel area BA may be disposed to be adjacent to the 1a-th area of the active area AA, and the 3b-th area of the bezel area BA may be disposed to be adjacent to the 1b-th area of the active area AA. Further, the 3a-th area of the bezel area BA may have the same free form portion as the 1a-th area of the active area AA, and the 3b-th area of the bezel area BA may have the same free form portion as the 1b-th area of the active area AA.

Referring to FIG. 3, the 1a-th area and the second area of the active area AA, and the 3a-th area and the fourth area of the bezel area BA will be described. Further, referring to FIG. 3, an example that four gate lines extending in a horizontal direction to intersect the first power source lines VD1 to VDm are disposed in parallel in the 1a-th area of the first area in the active area AA of FIG. 2 will be described, but the present disclosure is not limited thereto. For instance, three or less gate lines, or five or more gate lines may be disposed in the 1a-th area.

Further, an example that the pixels P have the same size in the active area AA corresponding to the 1a-th area and the second area will be described.

When four gate lines are disposed in the 1a-th area of the first area, first and second gate lines, disposed in an upper area of the 1a-th area, include 1a-th and 2a-th gate lines G1a and G2a which are sequentially supplied with first and second gate pulses from the left shift register SRa, and 1b-th and 2b-th gate lines G1b and G2b which are sequentially supplied with the first and second gate pulses from the right shift register SRb.

Referring to FIG. 3, the 1a-th area of the active area AA may include first and second sub active areas which are divided to the left and the right by the notch portion NO. The 1a-th and 2a-th gate lines G1a and G2a, disposed in the first sub active area located at the left side of the 1a-th area, extend from the first sub active area to the 3a-th area of the bezel area BA. For example, the 1a-th and 2a-th gate lines G1a and G2a, disposed in the first sub active area of the 1a-th area, extend from the first sub active area to a first compensation area located at the left side of the 3a-th area. The 1a-th and 2a-th gate lines G1a and G2a may be connected to a 1a-th dummy gate line GD1a and a 2a-th dummy gate line GD2a which are formed on a different layer from the 1a-th and 2a-th gate lines G1a and G2a in the first compensation area of the bezel area BA. The 1a-th gate line G1a and the 1a-th dummy gate line GD1a are connected to form an "inverted C" shape. Further, the 2a-th gate line G2a and the 2a-th dummy gate line GD2a are connected to form an "inverted C" shape.

The 1b-th and 2b-th gate lines G1b and G2b, disposed in the second sub active area located at the right side of the 1a-th area, may extend from the second sub active area to the 3a-th area of the bezel area BA. For example, the 1b-th and 2b-th gate lines G1b and G2b, disposed in the second sub active area of the 1a-th area, extend from the second sub active area to the second compensation area located at the right side of the 3a-th area. The 1b-th and 2b-th gate lines G1b and G2b may be connected to the 1b-th dummy gate line GD1b and the 2b-th dummy gate line GD2b formed on the different layer from the 1b-th and 2b-th gate lines G1b and G2b in the second compensation area of the bezel area BA. The 1b-th gate line G1b and the 1b-th dummy gate line GD1b are connected to form a "C" shape. Further, the 2b-th gate line G2b and the 2b-th dummy gate line GD2b are connected to form a "C" shape.

In the bezel area BA, the display panel 10 may include a first compensating unit DCA1 formed by overlapping the 1a-th and 2a-th dummy gate lines GD1a and GD2a, disposed in the first compensation area located at the left side of the 3a-th area, and the first power supply electrode VDLb, and a second compensating unit DCA2 formed by overlapping the 1b-th and 2b-th dummy gate lines GD1b and GD2b, disposed in the second compensation area located at the right side of the 3a-th area, and the first power supply electrode VDLb.

When four gate lines are disposed in the 1a-th area of the first area, third and fourth gate lines, disposed in a lower area of the 1a-th area, may include 3a-th and 4a-th gate lines G3a and G4a which are sequentially supplied with third and fourth gate pulses from the left shift register SRa, and 3b-th and 4b-th gate lines G3b and G4b which are sequentially supplied with the third and fourth gate pulses from the right shift register SRb.

For example, when four gate lines are disposed in the 1a-th area of the first area, two gate lines of 3a-th and 4a-th gate lines G3a and G4a, disposed in the lower area of the first sub active area of the 1a-th area, and two gate lines of 3b-th and 4b-th gate lines G3b and G4b, disposed in the lower area of the second sub active area of the 1a-th area, may be connected to each other by the third and fourth dummy gate lines GD3 and GD4 disposed in the 3a-th area of the bezel area BA located in the notch portion NO.

Referring to FIG. 3, the 3a-th and 4a-th gate lines G3a and G4a of the first sub active area, and the 3b-th and 4b-th gate lines G3*b* and G4*b* of the second sub active area may be connected to each other by the third and fourth dummy gate lines GD3 and GD4 disposed in the third compensation area of the 3a-th area of the bezel area BA located between the first sub active area and the second sub active area.

The display panel 10 may include the third compensating unit DCA3 which is formed by overlapping the third and fourth dummy gate lines GD3 and GD4, disposed in the third compensation area at the center of the 3a-th area, and the first power supply electrode VDLb.

The first compensating unit DCA1 and the second compensating unit DCA2 of the display panel 10 will be described in more detail with reference to FIGS. 5, 6A, and 6B, and the third compensating unit DCA3 will be described in more detail with reference to FIGS. 7, 8A, and 8B.

The first compensating unit DCA1 and the second compensating unit DCA2 are disposed in different positions, but have the substantially same structure, so that, in the following description with reference to FIGS. 5, 6A, and 6B, the first compensating unit DCA1 will be described as an example together with the second compensating unit DCA2.

Prior to description of first to third compensating units DCA1, DCA2, and DCA3, a cross-sectional structure of the pixel P in the active area AA will be described with reference to FIG. 4.

Figure 4:
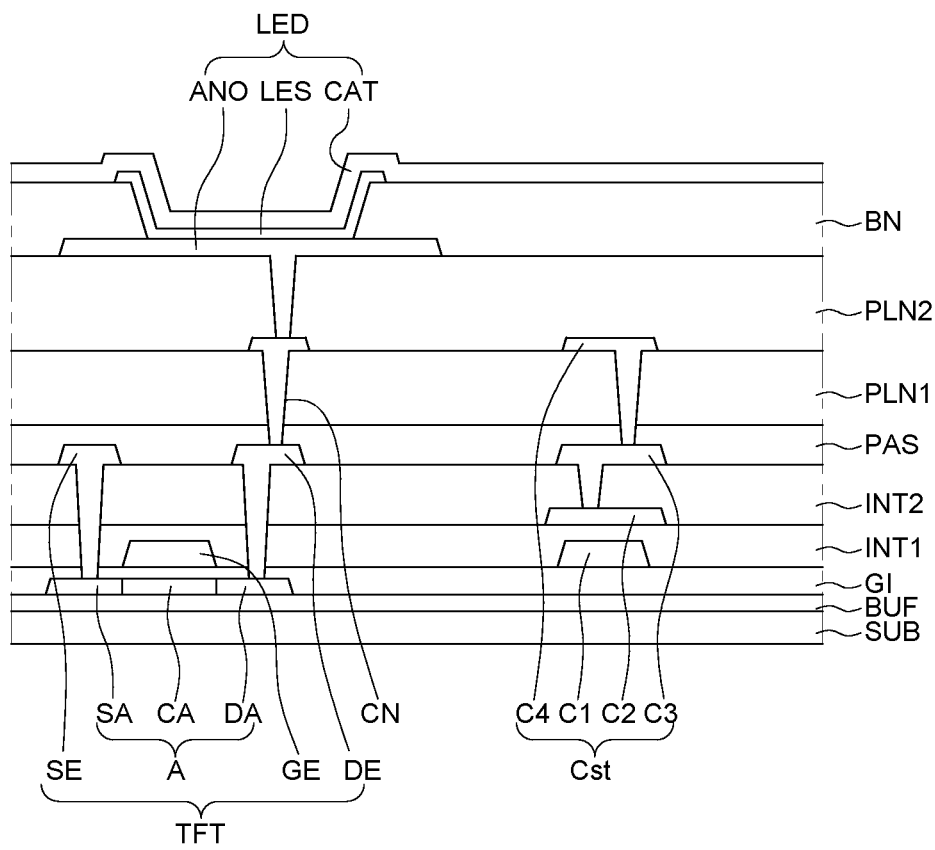
FIG. 4 is a cross-sectional view illustrating a structure in a pixel P illustrated in FIG. 1 according to an exemplary embodiment of the present disclosure.

FIG. 4 is a cross-sectional view illustrating a structure of a thin film transistor TFT, a storage capacitor Cst, and a light emitting diode LED in the pixel P illustrated in FIG. 1.

Referring to FIG. 4, a buffer layer BUF having a single layer or a multi-layered structure may be disposed on the substrate SUB. The substrate SUB may be formed of a flexible translucent material. When the substrate SUB is formed of a material such as polyimide, the buffer layer BUF may be formed of a single layer configured by any one of an inorganic material and an organic material in order to suppress the damage of the light emitting diode caused by impurities such as alkali ions leaked from the substrate SUB during a subsequent process. Further, the buffer layer BUF may be formed of a multiple layer formed of different inorganic materials. Further, the buffer layer BUF may be formed of a multiple layer formed of an organic material layer and an inorganic material layer. The inorganic material layer may include any one of a silicon oxide film SiOx and a silicon nitride layer SiNx, but is not limited thereto. The organic material may include photo acryl, but is not limited thereto.

A semiconductor layer A may be disposed on the buffer layer BUF. The semiconductor layer A may include a source area SA and a drain area DA which are spaced apart from each other with a channel area CA therebetween. The source area SA and the drain area DA may be conductive areas. The semiconductor layer A may be formed using amorphous silicon or polycrystalline silicon obtained by crystalizing the amorphous silicon. Alternatively, the semiconductor layer A may be formed of any one of zinc oxide ZnO, indium zinc oxide InZnO, indium gallium zinc oxide InGaZnO, and zinc tin oxide ZnSnO, but is not limited thereto. Further, the semiconductor layer (A) may be formed of a low molecular weight or high molecular weight organic material such as melocyanine, phthalocyanine, pentacene, and thiophene polymer, but is not limited thereto.

A gate insulating layer GI may be disposed on the buffer layer BUF on which the semiconductor layer A is disposed to cover the semiconductor layer A. The gate insulating layer GI may be formed of a single layer formed of an inorganic material or a multiple layer formed of different inorganic materials. For example, the gate insulating layer GI may be formed of a silicon oxide film SiOx, a silicon nitride layer SiNx or a multiple layer thereof, but is not limited thereto.

A gate electrode GE of the thin film transistor TFT and a gate line connected to the gate electrode GE may be disposed on the gate insulating layer GI so as to partially overlap the channel area CA of the semiconductor layer A. A first electrode C1 of the storage capacitor Cst may be disposed on the gate insulating layer GI. The gate electrode GE, the gate line, and the first electrode C1 may be any one of molybdenum (Mo), aluminum (Al), chrome (Cr), gold (Au), titanium (Ti), nickel (Ni), and copper (Cu), or an alloy thereof and formed as a single layer or a multilayer, but are not limited thereto.

A first interlayer insulating layer INT1 may be disposed on the gate insulating layer GI on which the gate electrode GE, the gate line, and the first electrode C1 of the storage capacitor Cst are disposed to cover the components. The first interlayer insulating layer INT1 may be formed of a single layer formed of an inorganic material or a multiple layer formed of different inorganic materials. For example, the first interlayer insulating layer INT1 may be formed of a silicon oxide film SiOx or a silicon nitride layer SiNx, but is not limited thereto.

A second electrode C2 of the storage capacitor Cst may be disposed on the first interlayer insulating layer INT1 so as to overlap the first electrode C1. The second electrode C2 may be any one of molybdenum (Mo), aluminum (Al), chrome (Cr), gold (Au), titanium (Ti), nickel (Ni), and copper (Cu) or an alloy thereof and formed as a single layer or a multilayer, but is not limited thereto.

Further, a second interlayer insulating layer INT2 may be disposed to cover the second electrode C2 of the storage capacitor Cst. The second interlayer insulating layer INT2 may be formed of a single layer formed of an inorganic material or a multiple layer formed of different inorganic materials. For example, the second interlayer insulating layer INT2 may be formed of a silicon oxide film SiOx, a silicon nitride layer SiNx, or a double layer thereof, but is not limited thereto.

The source electrode SE and the drain electrode DE of the thin film transistor TFT may be disposed on the second interlayer insulating layer INT2. A third electrode C3 may be disposed on the second interlayer insulating layer INT2 so as to overlap the second electrode C2 of the storage capacitor Cst. The source electrode SE and the drain electrode DE may be connected to the source area SA and the drain area DA of the semiconductor layer exposed through contact holes which pass through the gate insulating layer GI, the first and second interlayer insulating layers INT1 and INT2, respectively. The third electrode C3 of the storage capacitor Cst may be connected to the second electrode C2 exposed through the contact hole of the second interlayer insulating layer INT2. The source electrode SE, the drain electrode DE, and the third electrode C3 of the storage capacitor Cst may be any one of molybdenum (Mo), aluminum (Al), chrome (Cr), gold (Au), titanium (Ti), nickel (Ni), and copper (Cu) or an alloy thereof and formed as a single layer or a multilayer, but are not limited thereto.

A passivation layer PAS may be disposed to cover the source electrode SE, the drain electrode DE, and the third electrode C3 of the storage capacitor Cst. The passivation layer PAS may be formed of a single layer formed of an inorganic material or a multiple layer formed of different inorganic materials. For example, the passivation layer PAS may be formed of a silicon oxide film SiOx, a silicon nitride layer SiNx or a double layer thereof, but is not limited thereto.

A first planarizing layer PLN1 may be disposed on the passivation layer PAS. The first planarizing layer PLN1 is formed to ease a step of a lower structure and protect the lower structure and formed of an organic material layer. For example, the first planarizing layer PLN1 may be formed by a photo acrylic layer. A connection electrode CN which connects the anode electrode ANO of the light emitting diode LED which will be described below to the drain electrode DE may be disposed on the first planarizing layer PLN1. Further, a fourth electrode C4 which is connected to the third electrode C3 of the storage capacitor Cst may be disposed on the first planarizing layer PLN1. The connection electrode CN is connected to the drain electrode DE of the thin film transistor TFT which is exposed through the contact holes of the first planarizing layer PLN1 and the passivation layer PAS. The fourth electrode C4 of the storage capacitor Cst may be connected to the third electrode C3 of the storage capacitor Cst which is exposed through the contact holes of the first planarizing layer PLN1 and the passivation layer PAS. The connection electrode CN and the fourth electrode C4 of the storage capacitor Cst may be any one of molybdenum (Mo), aluminum (Al), chrome (Cr), gold (Au), titanium (Ti), nickel (Ni), and copper (Cu) or an alloy thereof and formed as a single layer or a multilayer, but are not limited thereto.

A second planarizing layer PLN2 may be disposed on the first planarizing layer PLN1 to cover the connection electrode CN and the fourth electrode C4 of the storage capacitor Cst. The second planarizing layer PLN2 may be a planarizing layer which further protects the lower structure while further easing the step of the lower structure due to the connection electrode CN and the fourth electrode C4 of the storage capacitor on the first planarizing layer PLN1. The second planarizing layer PLN2 may be formed of an organic material layer. For example, the second planarizing layer PLN2 may be formed of a siloxane based organic material, but is not limited thereto.

The anode electrode ANO may be disposed on the second planarizing layer PLN2. The anode electrode ANO is connected to the connection electrode CN exposed through the contact hole which passes through the second planarizing layer PLN2. The anode electrode ANO may be formed of a transparent conductive material such as indium tin oxide (ITO), indium zinc oxide (IZO), or zinc oxide (ZnO), but is not limited thereto.

A bank layer BN having an opening which exposes the anode electrode ANO may be formed on the second planarizing layer PLN2.

The opening of the bank layer BN may be an area which defines an emission area. A light emission stack LES and a cathode electrode CAT may be laminated on the anode electrode ANO exposed through the opening of the bank layer BN. The light emission stack LES may include a hole transport layer, a light emitting layer, and an electron transport layer. The cathode electrode CAT may be formed of magnesium (Mg), calcium (Ca), aluminum (Al), or silver (Ag) having a low work function or an alloy thereof, but is not limited thereto. In the present disclosure, it is described that the light emission stack LES is disposed on the anode electrode ANO and the cathode electrode CAT is disposed on the light emission stack LES. However, in other embodiments, the light emission stack LES may be disposed on the cathode electrode CAT and the anode electrode ANO may be disposed on the light emission stack LES.

An encapsulation layer ENC (not shown) may be disposed on the second planarizing layer PLN2 to cover the cathode electrode CAT and the bank layer BN. The encapsulation layer ENC is provided to suppress the moisture or oxygen from the outside from being penetrated into the light emission stack LES located in the encapsulation layer ENC and may be formed to have a multilayered structure in which the inorganic material layer and the organic material layer are alternately disposed.

Next, the first compensating unit DCA1 and the second compensating unit DCA2 of the display panel 10 will be described in more detail with reference to FIGS. 3, 5, 6A, and 6B. FIG. 5 is a plan view enlarging a partial area of a first compensating unit DCA1 of FIG. 3, FIG. 6A is a cross-sectional view taken along the line A-A of FIG. 5, and FIG. 6B is a cross-sectional view taken along line B-B' of FIG. 5. However, it is to be noted that the arrangement and structure of the first compensating unit DCA1 or the second compensating unit DCA2 described with reference to FIGS. 5, 6A and 6B are just shown for exemplary purposes, and the present application is not limited thereto.

Figure 5:
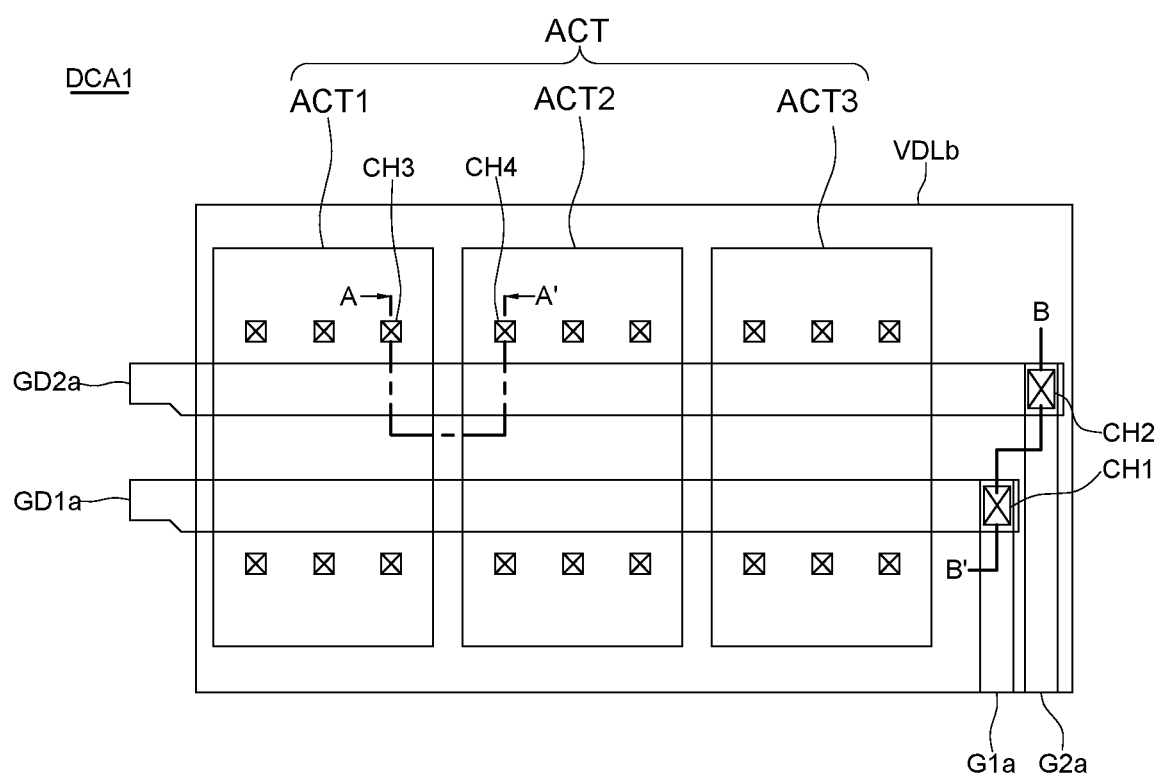
FIG. 5 is a plan view enlarging a partial area of a first compensating unit of FIG. 3 according to an exemplary embodiment of the present disclosure.
Figure 6A:
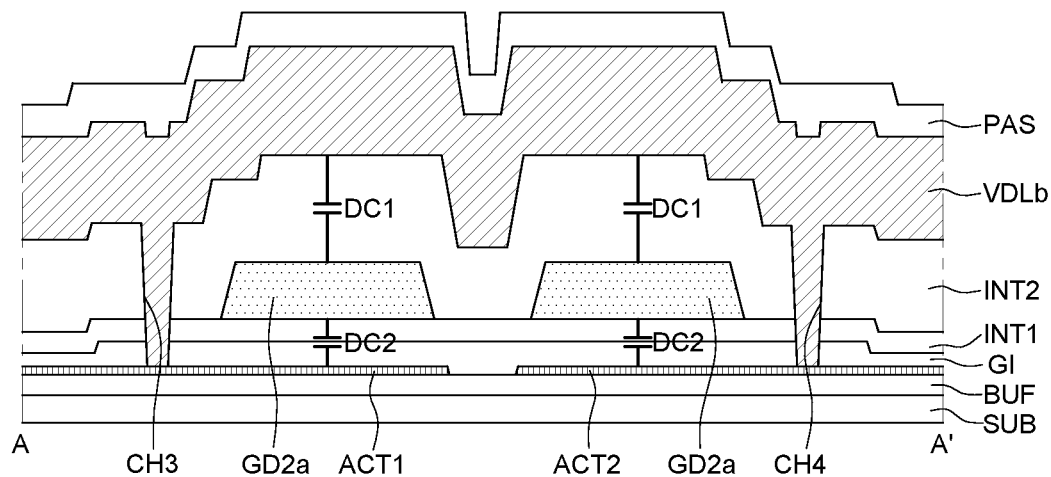
FIG. 6A is a cross-sectional view taken along the line A-A' of FIG. 5 according to an exemplary embodiment of the present disclosure.
Figure 6B:
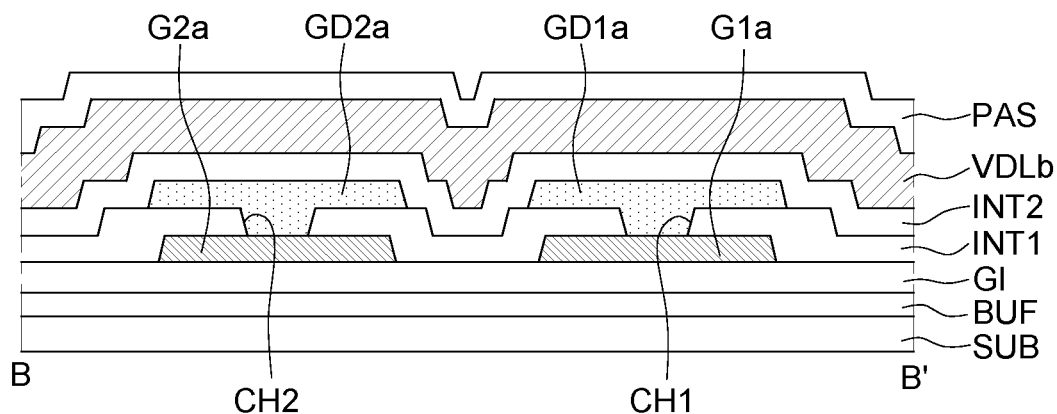
FIG. 6B is a cross-sectional view taken along line B-B' of FIG. 5 according to an exemplary embodiment of the present disclosure.

Referring to FIGS. 5, 6A, and 6B, the first compensating unit DCA1 of the display panel 10 may include a buffer layer BUF disposed on the substrate SUB, and a semiconductor pattern ACT disposed on the buffer layer BUF. The semiconductor pattern ACT of the first compensating unit DCA1 may be formed by the same process on the same layer as the semiconductor layer A of the thin film transistor TFT. The semiconductor pattern ACT of the first compensating unit DCA1 may be formed of the same material as the semiconductor layer A of the thin film transistor TFT. The semiconductor pattern ACT of the first compensating unit DCA1 may be a layer formed by making the semiconductor material conductive. The conduction of the semiconductor pattern ACT of the first compensating unit DCA1 may be performed together when the source area SA and the drain area DA of the semiconductor layer A of the thin film transistor TFT are made to be conductive. The semiconductor pattern ACT of the first compensating unit DCA1 may include a plurality of semiconductor patterns (for example, ACT1 to ACT3). The gate insulating layer GI may be disposed on the buffer layer BUF to cover the semiconductor pattern ACT.

Referring to FIGS. 5, 6A, and 6B, the 2a-th gate line G2*a* and the 1a-th gate line G1*a* may be disposed in parallel to each other on the gate insulating layer GI.

Further, the first interlayer insulating layer INT1 may be disposed on the gate insulating layer GI to cover the 2a-th gate line G2*a* and the 1a-th gate line G1*a*. The 2a-th dummy gate line GD2*a* and the 1a-th dummy gate line GD1*a* may be disposed in parallel to each other on the first interlayer insulating layer INT1 to at least partially overlap the 2a-th gate line G2*a* and the 1a-th gate line G1*a*. The 2a-th dummy gate line GD2*a* is connected to the 2a-th gate line G2*a* through the second contact hole CH2 which passes through the first interlayer insulating layer INT1. The 1a-th dummy gate line GD1*a* is connected to the 1a-th gate line G1*a* through the first contact hole CH1 which passes through the first interlayer insulating layer INT1. Referring to FIGS. 6A and 6B, the 2a-th gate line G2*a* and the 1a-th gate line G1*a* may be formed by the same process as the gate electrode GE of the thin film transistor TFT on the same layer. The 2a-th gate line G2*a* and the 1a-th gate line G1*a* may be formed of the same material as the gate electrode GE of the thin film transistor TFT. The 1a-th dummy gate line GD1*a* and the 2a-th dummy gate line GD2*a* may be formed by the same process as the second electrode C2 of the storage capacitor Cst, on the same layer. The 1a-th dummy gate line GD1*a* and the 2a-th dummy gate line GD2a may be formed of the same material as the second electrode C2 of the storage capacitor Cst.

Referring to FIGS. 5, 6A, and 6B, the 1a-th dummy gate line GD1a and the 2a-th dummy gate line GD2a may be disposed to overlap the plurality of semiconductor patterns (for example ACT1, ACT2, and ACT3). In order to compensate the capacitance difference caused by the difference between the number of pixels in the 1a-th area of the first area having the free form portion in the active area AA and the number of pixels in the second area which does not have a free form portion, the overlapping area of the plurality of semiconductor patterns ACT1, ACT2, and ACT3 and the 1a-th dummy gate line GD1a and the 2a-th dummy gate line GD2a may vary. For example, the overlapping area of the semiconductor pattern ACT and the 1a-th dummy gate line GD1a and the 2a-th dummy gate line GD2a may vary using the number or the size of the semiconductor pattern ACT. Alternatively, the overlapping area of the semiconductor pattern ACT and the 1a-th dummy gate line GD1a and the 2a-th dummy gate line GD2a may vary by adjusting a width or a length of at least one of the 1a-th dummy gate line GD1a and the 2a-th dummy gate line GD2a. Specifically, in FIG. 5, even though the 1a-th dummy gate line GD1a and the 2a-th dummy gate line GD2a are illustrated as straight lines, the 1a-th dummy gate line GD1a and the 2a-th dummy gate line GD2a may be formed to have a concave and convex shape having a curve or a stepped shape. As described above, when the 1a-th dummy gate line GD1a and the 2a-th dummy gate line GD2a are formed to have a concave and convex shape or a stepped shape, the length may be longer than the length of the 1a-th dummy gate line GD1a and the 2a-th dummy gate line GD2a which are formed as straight lines as illustrated in FIG. 5. Therefore, the overlapping area of the semiconductor pattern ACT and the 1a-th dummy gate line GD1a and the 2a-th dummy gate line GD2a may be increased. Further, the capacitance for compensation may be increased.

The second interlayer insulating layer INT2 may be disposed on the first interlayer insulating layer INT1 to cover the 1a-th dummy gate line GD1a and the 2a-th dummy gate line GD2a.

The first power supply electrode VDLb, which overlaps the 2a-th dummy gate line GD2a and the 1a-th dummy gate line GD1a, may be disposed on the second interlayer insulating layer INT2. The first power supply electrode VDLb may be connected to the semiconductor patterns ACT through third and fourth contact holes CH3 and CH4 which pass through the second interlayer insulating layer INT2, the first interlayer insulating layer INT1, and the gate insulating layer GI. The first power supply electrode VDLb may overlap the plurality of semiconductor patterns ACT1, ACT2, and ACT3. The first power supply electrode VDLb may be disposed to be adjacent to the 1a-th area of the active area AA. The first power supply electrode VDLb may be disposed in a 3a-th area of the bezel area BA.

A passivation layer PAS may be disposed on the first power supply electrode VDLb to protect the first power supply electrode VDLb.

At least one of the first planarizing layer PLN1, the second planarizing layer PLN2, and the encapsulation layer ENC may be formed on the passivation layer PAS.

The second compensating unit DCA2 may be formed to be similar to the first compensating unit DCA1 and formed by the same way as the first compensating unit DCA1, so that the same description will be omitted.

Next, a third compensating unit DCA3 of the display panel 10 will be described in more detail with reference to FIGS. 3, 7, 8A, and 8B. However, it is to be noted that the arrangement and structure of the third compensating unit DCA3 described with reference to FIGS. 7, 8A and 8B are just shown for exemplary purposes, and the present application is not limited thereto.

Figure 7:
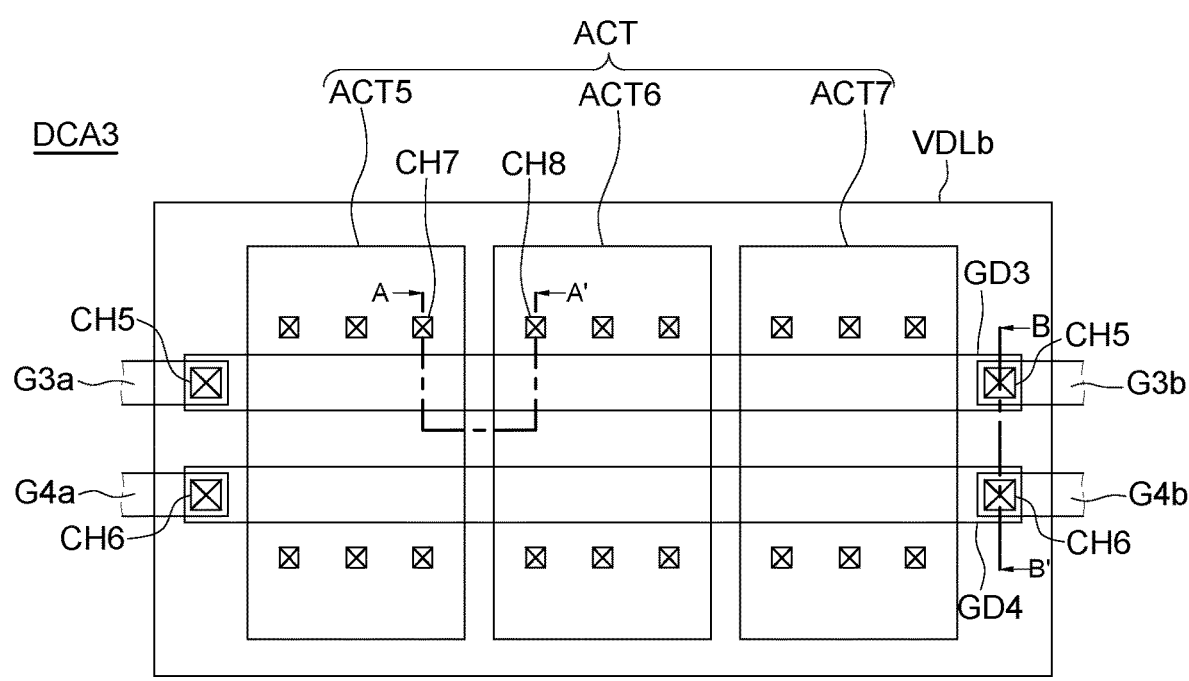
FIG. 7 is a plan view enlarging a partial area of a third compensating unit of FIG. 3 according to an exemplary embodiment of the present disclosure.
Figure 8A:
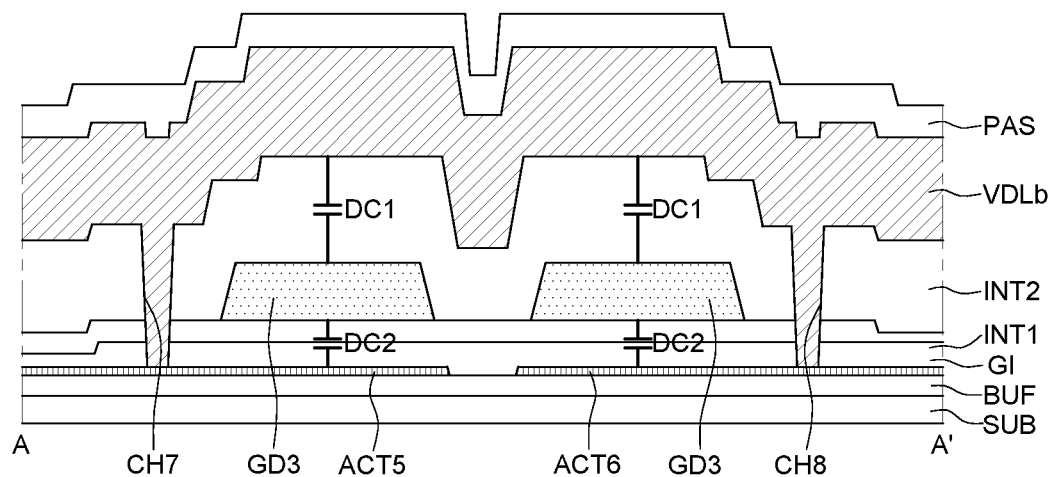
FIG. 8A is a cross-sectional view taken along the line A-A' of FIG. 7 according to an exemplary embodiment of the present disclosure.

FIG. 7 is a plan view enlarging a partial area of a third compensating unit DCA3 of FIG. 3, FIG. 8A is a cross-sectional view taken along the line A-A' of FIG. 7, and FIG. 8A is a cross-sectional view taken along the line B-B'.

Figure 8B:
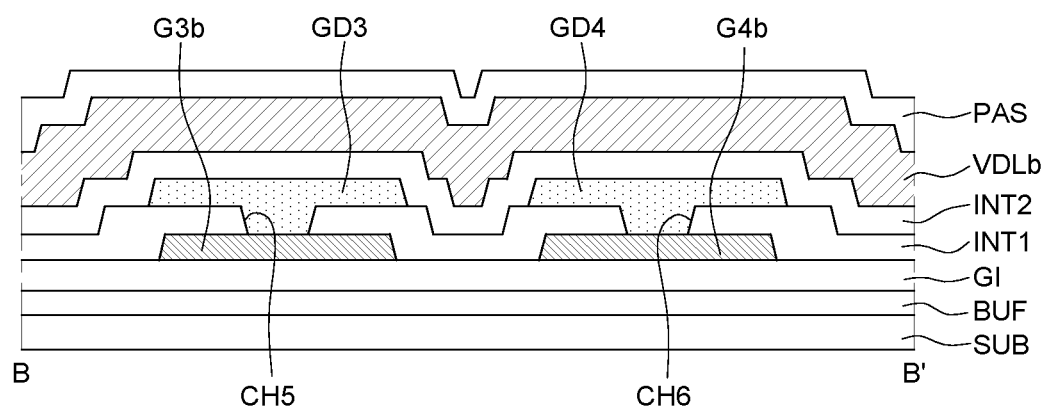
FIG. 8B is a cross-sectional view taken along line B-B' of FIG. 7 according to an exemplary embodiment of the present disclosure.

Referring to FIGS. 7, 8A, and 8B, the third compensating unit DCA3 of the display panel 10 may include a buffer layer BUF disposed on the substrate SUB and a plurality of semiconductor patterns (for example, ACT5, ACT6, and ACT7) disposed on the buffer layer BUF. The semiconductor pattern ACT of the third compensating unit DCA3 may be formed by the same process as the semiconductor layer A of the thin film transistor TFT, on the same layer. The semiconductor pattern ACT of the third compensating unit DCA3 may be formed of the same material as the semiconductor layer A of the thin film transistor TFT. The semiconductor pattern ACT of the third compensating unit DCA3 may be a layer formed by making the semiconductor material conductive. The conduction of the semiconductor pattern ACT of the third compensating unit DCA3 may be performed together when the source area SA and the drain area DA of the semiconductor layer A of the thin film transistor TFT are made to be conductive. The gate insulating layer GI may be disposed on the buffer layer BUF so as to cover the semiconductor patterns ACT5, ACT6, and ACT7.

Referring to FIGS. 3, 7, 8A, and 8B, the 3a-th gate line G3a and the 3b-th gate line G3b may be disposed to be separated from each other on the same line on the gate insulating layer GI. Further, a 4a-th gate line G4a and a 4b-th gate line G4b may be disposed to be separated from each other. The 3a-th gate line G3a and the 4a-th gate line G4a may be disposed in parallel to each other. Further, the 3b-th gate line G3b and the 4b-th gate line G4b may be disposed in parallel to each other.

The first interlayer insulating layer INT1 may be disposed on the gate insulating layer GI to cover the 3a-th gate line G3a, the 3b-th gate line G3b, the 4a-th gate line G4a, and the 4b-th gate line G4b. On the first interlayer insulating layer INT1, a third dummy gate line GD3 may be disposed to overlap one end of the 3a-th gate line G3a and one end of the 3b-th gate line G3b and a fourth dummy gate line GD4 may be disposed to overlap one end of the 4a-th gate line G4a and one end of the 4b-th gate line G4b.

The third dummy gate line GD3 may be connected to the 3a-th and 3b-th gate lines G3a and G3b, respectively, through fifth contact holes CH5 which pass through the first interlayer insulating layer INT1. The fourth dummy gate line GD4 may be connected to the 4a-th and 4b-th gate lines G4a and G4b, respectively, through sixth contact holes CH6 which pass through the first interlayer insulating layer INT1.

The 3a-th gate line G3a, the 3b-th gate line G3b, the 4a-th gate line G4a, and the 4b-th gate line G4b may be formed of the same process as the gate electrode GE of the thin film transistor TFT, on the same layer. The 3a-th gate line G3a, the 3b-th gate line G3b, the 4a-th gate line G4a, and the 4b-th gate line G4b may be formed of the same material as the gate electrode GE of the thin film transistor TFT. The third dummy gate line GD3 and the fourth dummy gate line GD4 may be formed by the same process as the second electrode C2 of the storage capacitor Cst, on the same layer.

The third dummy gate line GD3 and the fourth dummy gate line GD4 may be formed of the same material as the second electrode C2 of the storage capacitor Cst.

Referring to FIGS. 7, 8A, and 8B, the second interlayer insulating layer INT2 may be disposed on the first interlayer insulating layer INT1 to cover the third dummy gate line GD3 and the fourth dummy gate line GD4.

The first power supply electrode VDLb which overlaps the third dummy gate line GD3 and the fourth dummy gate line GD4 may be disposed on the second interlayer insulating layer INT2. The first power supply electrode VDLb may be connected to the semiconductor patterns ACT5 and ACT6 through seventh and eighth contact holes CH7 and CH8 which pass through the second interlayer insulating layer INT2, the first interlayer insulating layer INT1, and the gate insulating layer GI to expose the semiconductor patterns ACT5 and ACT6. The first power supply electrode VDLb may overlap the plurality of semiconductor patterns ACT5, ACT6, and ACT7. The first power supply electrode VDLb may be disposed to be adjacent to the 1a-th area of the active area AA. The first power supply electrode VDLb may be disposed in a 3a-th area of the bezel area BA.

A passivation layer PAS may be disposed on the first power supply electrode VDLb to protect the first power supply electrode VDLb.

The first compensating unit DCA1 according to the above-described configuration may include, as illustrated in FIGS. 5, 6A, and 6B, a first compensation component of first compensating capacitances DC1 formed by each dummy gate line GD1a or GD2a and the first power supply electrode VDLb and a second compensation component of second compensating capacitances DC2 formed by each dummy gate line GD1a or GD2a and the plurality of semiconductor patterns ACT1, ACT2, and ACT3.

Similarly to the first compensating unit DCA1, the second compensating unit DCA2 may include a first compensation component of first compensating capacitances DC1, formed by each dummy gate line GD1b or GD2b and the first power supply electrode VDLb, and a second compensation component of second compensating capacitances DC2 formed by each dummy gate line GD1b or GD2b and the plurality of semiconductor patterns.

The third compensating unit DCA3 may include, as illustrated in FIGS. 7, 8A, and 8B, a first compensation component of first compensating capacitances DC1 formed by each dummy gate line GD3 or GD4 and the first power supply electrode VDLb and a second compensation component of second compensating capacitances DC2 formed by each dummy gate line GD3 or GD4 and the plurality of semiconductor patterns ACT5, ACT6 and ACT7.

Therefore, in the display apparatus according to the exemplary embodiment of the present disclosure, the display panel 10 may maximize a compensation capacitance in a limited space of the 3a-th area of the bezel area BA located to be adjacent to the first and second sub active areas, by means of the first compensating unit DCA1 and the second compensating unit DCA2 having a double compensation capacitor structure of the first capacitance C1 and the second capacitance C2. Further, the third compensating unit DCA3 also has the double compensation capacitor structure, similar to the first compensating unit DCA1, so that the compensation capacitance may be maximized in the limited space of the 3a-th area located to be adjacent to the notch portion NO of the active area AA. For example, the third compensating unit DCA3 also has the double compensation capacitor structure similar to the first compensating unit DCA1, so that the compensation capacitance may be maximized in the 3a-th area of the bezel area BA corresponding to an area between the first and second sub active areas. Therefore, the R-C load per pixel line may be increased by the first compensating unit DCA1, the second compensating unit DCA2, and the third compensating unit DCA3 located in the 3a-th area of the bezel area BA to be compensated to be close to the R-C load per pixel line disposed in the second area which is a non-free form portion of the active area AA. Therefore, the luminance nonuniformity of the display panel may be improved.

Next, the luminance improvement effect achieved by the display apparatus according to the exemplary embodiment of the present disclosure will be described with reference to FIG. 9.

Figure 9:
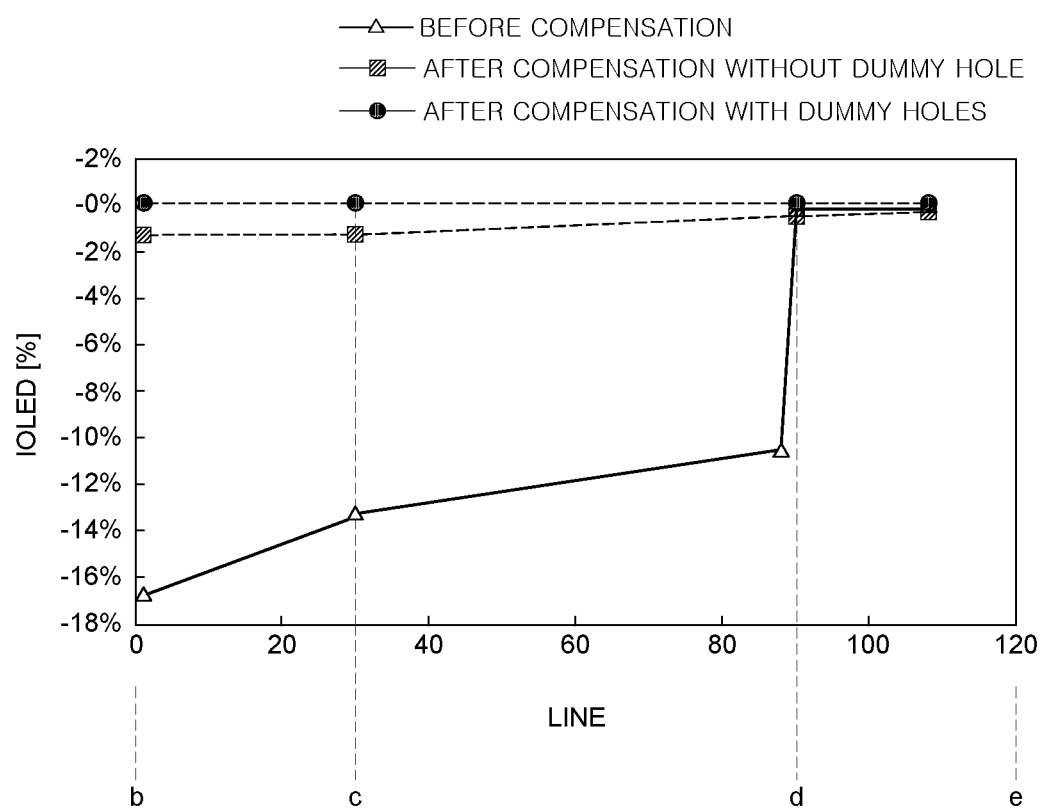
FIG. 9 is a graph obtained by comparing a luminance before compensation and a luminance of a display apparatus after compensation according to an exemplary embodiment of the present disclosure according to an exemplary embodiment of the present disclosure.

FIG. 9 is a graph illustrating a luminance change of a display apparatus in which a compensating unit is not formed and a luminance change of a display apparatus in which a compensating unit according to an exemplary embodiment of the present disclosure is formed. In FIG. 9, a solid line indicates a luminance change of a display apparatus in which a compensating unit is not formed and two dotted lines indicates a luminance change of a display apparatus in which a compensating unit according to an exemplary embodiment of the present disclosure is formed. One of the two dotted lines indicates a luminance change of a display apparatus in which a compensation unit without dummy holes is formed. The other of the two dotted lines indicates a luminance change of a display apparatus in which a compensation unit including dummy holes is formed. In FIG. 9, a reference luminance of the display apparatus is set to be 150 nit.

In FIG. 9, a horizontal axis represents gate lines (first to thirtieth lines) corresponding to a b-c section of the 1a-th area of the display apparatus illustrated in FIG. 2, gate lines (thirtieth to ninetieth lines) corresponding to a c-d section of the 1a-th area, and gate lines (ninetieth to one hundred twentieth lines) corresponding to a part of a d-e section of the second area. Further, a vertical axis represents a luminance change of the display apparatus. On the vertical axis, 0% means that there is no luminance change of the display apparatus as compared with the reference luminance 150 nit.

Referring to FIG. 9, from the solid line representing the luminance change of the display apparatus in which the compensating unit is not formed, it is confirmed that there is no luminance change in the d-e section of the second area which is an active area having a non-free form portion, but there is luminance change in the b-c section and the c-d section of the 1a-th area which is an active area having a free form portion. Therefore, it is understood that the changed amount of the luminance is approximately 6 to 18% with respect to the reference luminance.

In FIG. 9, from one of the two dotted lines representing the luminance change of the display apparatus in which the compensating unit without dummy holes is formed, it is confirmed that there is no luminance change in the d-e section of the second area which is an active area having a non-free form portion. Also, in the b-c section and the c-d section of the 1a-th area which is an active area having a free form portion, the luminance uniformity of the display panel is improved through the formed compensating unit, by decreasing the changed amount of the luminance from approximately 6 to 18% to approximately 1 to 2% with respect to the reference luminance.

In FIG. 9, from the other of the two dotted lines representing the luminance change of the display apparatus in which the compensating unit including dummy holes is formed, it is understood that there is no luminance change not only in the d-e section of the second area which is an active area having a non-free form portion, but also in the b-c section and the c-d section of the 1a-th area which is an active area having a free form portion. Accordingly, the luminance uniformity of the display panel can be further improved by forming the compensating unit including dummy holes.

In FIG. 9, it can be confirmed that the R-C load of the gate line located in the 1a-th area of the active area AA including a free form portion is increased by the first compensating unit DCA1, the second compensating unit DCA2, and the third compensating unit DCA3 located in the 3a-th area of the bezel area BA to be compensated to be close to the R-C load per gate line located in the second area of the active area AA having a non-free form portion.

The R-C load per gate line of the 1a-th area may be increased by the first compensating unit DCA1, the second compensating unit DCA2, and the third compensating unit DCA3 located in the 3a-th area of the bezel area BA located to be adjacent to the 1a-th area to be compensated to be close to the R-C load per gate line of the second area in the active area AA. Therefore, the luminance nonuniformity of the display panel may be improved.

Figure 10:
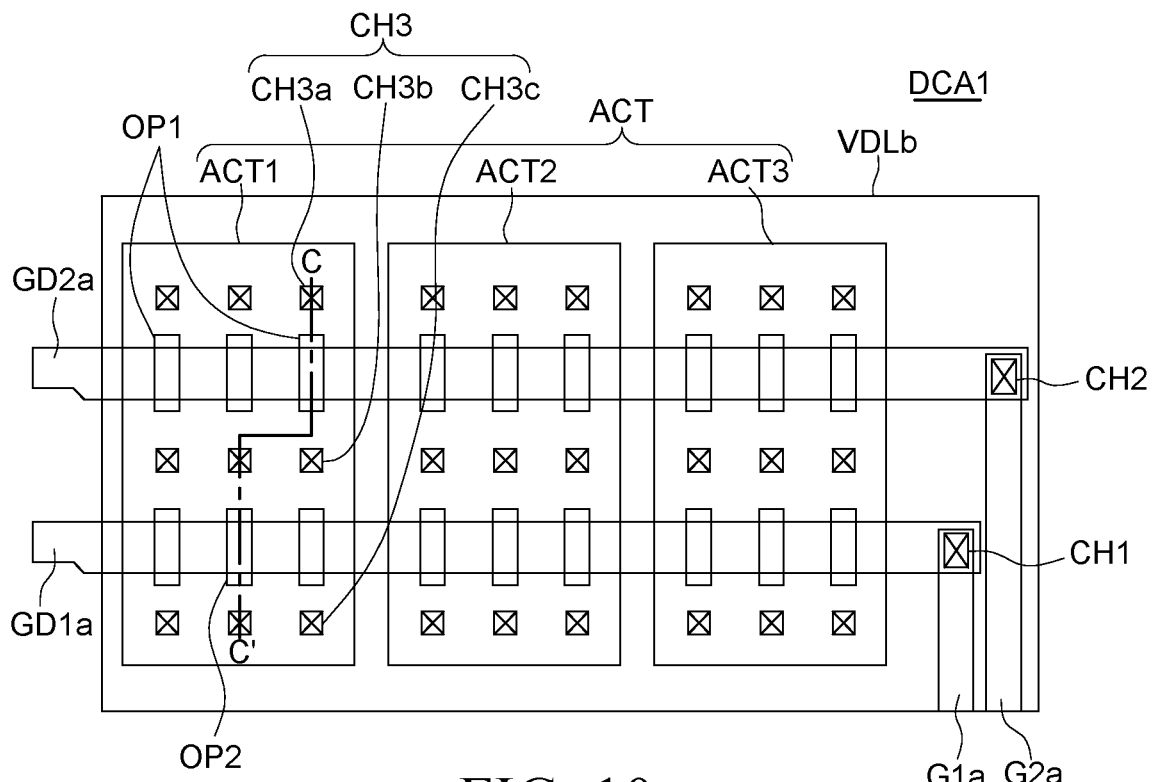
FIG. 10 is a plan view enlarging a partial area of a first compensating unit of FIG. 3 according to an exemplary embodiment of the present disclosure.
Figure 11:
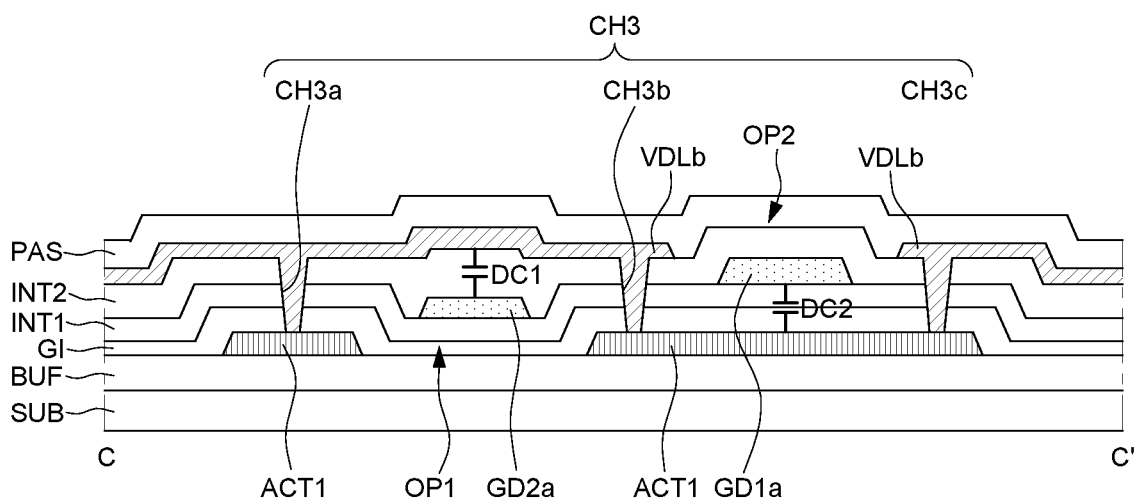
FIG. 11 is a cross-sectional view taken along line C-C' of FIG. 10 according to an exemplary embodiment of the present disclosure.

FIG. 10 is a plan view enlarging a partial area of a first compensating unit DCA1 of FIG. 3 and FIG. 11 is a cross-sectional view taken along line C-C' of FIG. 10. FIGS. 10 and 11 will be described with reference to FIGS. 3, 5, 6A, and 6B and a repeated portion may be omitted or briefly described.

Referring to FIGS. 10 and 11, the first compensating unit DCA1 of the display panel 10 may include a buffer layer BUF disposed on the substrate SUB and a semiconductor pattern ACT disposed on the buffer layer BUF. The semiconductor pattern ACT of the first compensating unit DCA1 may be formed by the same process as the semiconductor layer A of the thin film transistor TFT, on the same layer. The semiconductor pattern ACT of the first compensating unit DCA1 may be formed of the same material as the semiconductor layer A of the thin film transistor TFT. The semiconductor pattern ACT of the first compensating unit DCA1 may be a layer formed by making the semiconductor material conductive. The conduction of the semiconductor pattern ACT of the first compensating unit DCA1 may be performed together when the source area SA and the drain area DA of the semiconductor layer A of the thin film transistor TFT are made to be conductive. The semiconductor pattern ACT of the first compensating unit DCA1 may include a plurality of semiconductor patterns (for example, ACT1 to ACT3).

Referring to FIG. 10, the 1a-th dummy gate line GD1a and the 2a-th dummy gate line GD2a may be disposed to overlap the plurality of semiconductor patterns (for example ACT1, ACT2, and ACT3). In order to compensate the capacitance difference caused by the difference between the number of pixels in the 1a-th area of the first area having the free form portion in the active area AA and the number of pixels in the second area which does not have a free form portion, the overlapping area of the plurality of semiconductor patterns ACT1, ACT2, and ACT3 and the 1a-th dummy gate line GD1a and the 2a-th dummy gate line GD2a may vary.

For example, the overlapping area of the semiconductor pattern ACT and the 1a-th dummy gate line GD1a and the 2a-th dummy gate line GD2a may vary using the number or the size of the semiconductor patterns ACT. Further, the overlapping area of the semiconductor pattern ACT and the 1a-th dummy gate line GD1a and the 2a-th dummy gate line GD2a may vary by adjusting a width or a length of at least one of the 1a-th dummy gate line GD1a and the 2a-th dummy gate line GD2a.

For example, the overlapping area of the semiconductor pattern ACT and the 1a-th dummy gate line GD1a and the 2a-th dummy gate line GD2a may vary by forming a first opening OP1 in the semiconductor pattern ACT. For example, as illustrated in FIGS. 10 and 11, a partial area of the semiconductor pattern ACT which overlaps the 1a-th dummy gate line GD1a and the 2a-th dummy gate line GD2a is removed to form the first opening OP1. A width of the first opening OP1 may be larger than a width of the 1a-th dummy gate line GD1a and the 2a-th dummy gate line GD2a.

Corresponding to a value of the capacitance for compensation, a width of the first opening OP1 may be formed to be smaller than a width of the 1a-th dummy gate line GD1a and the 2a-th dummy gate line GD2a.

Referring to FIG. 10, a first opening OP1 is located in the semiconductor pattern ACT, and a plurality of first openings OP1 may be formed.

The gate insulating layer GI and the first interlayer insulating layer INT1 may be disposed on the buffer layer BUF to cover the semiconductor pattern ACT and the first opening OP1. Further, the 1a-th dummy gate line GD1a and the 2a-th dummy gate line GD2a may be disposed on the first interlayer insulating layer INT1 to overlap the semiconductor pattern ACT and the first opening OP1.

The 1a-th dummy gate line GD1a and the 2a-th dummy gate line GD2a may be formed by the same process as the second electrode C2 of the storage capacitor Cst, on the same layer. The 1a-th dummy gate line GD1a and the 2a-th dummy gate line GD2a may be formed of the same material as the second electrode C2 of the storage capacitor Cst.

Referring to FIG. 11, the second interlayer insulating layer INT2 may be disposed on the first interlayer insulating layer INT1 to cover the 1a-th dummy gate line GD1a and the 2a-th dummy gate line GD2a.

The first power supply electrode VDLb which overlaps the 2a-th dummy gate line GD2a and the 1a-th dummy gate line GD1a may be disposed on the second interlayer insulating layer INT2. The first power supply electrode VDLb may be connected to the semiconductor patterns ACT through a third contact hole CH3 which passes through the second interlayer insulating layer INT2, the first interlayer insulating layer INT1, and the gate insulating layer GI. The first power supply electrode VDLb may overlap the plurality of semiconductor patterns ACT1, ACT2, and ACT3. Further, a partial area of the first power supply electrode VDLb which overlaps the 1a-th dummy gate line GD1a and the 2a-th dummy gate line GD2a is removed to form a second opening OP2. A width of the second opening OP2 may be formed to be larger than a width of the 1a-th dummy gate line GD1a and the 2a-th dummy gate line GD2a. Depending on the capacitance for compensation, a width of the second opening OP2 may be formed to be smaller than the width of the 1a-th dummy gate line GD1a and the 2a-th dummy gate line GD2a. The second opening OP2 may be disposed to overlap the semiconductor pattern ACT.

Referring to FIG. 11, the third contact holes CH3 which pass through the second interlayer insulating layer INT2, the first interlayer insulating layer INT1, and the gate insulating layer GI to expose the semiconductor pattern ACT may be disposed on both sides of the 1a-th dummy gate line GD1a and the 2a-th dummy gate line GD2a and may be disposed so as not to overlap the first opening OP1. For example, a 3a-th contact hole CH3a and a 3b-th contact hole CH3b may be disposed on both sides of the 2a-th dummy gate line GD2a and the 3b-th contact hole CH3b and a 3c-th contact hole CH3c may be disposed on both sides of the 1a-th dummy gate line GD1a. Further, the 3a-th contact hole CH3a, the 3b-th contact hole CH3b, and the 3c-th contact hole CH3c may be disposed so as not to overlap the first opening OP1 of the semiconductor pattern ACT.

The second opening OP2 of the first power supply electrode VDLb may be disposed to overlap the 1a-th dummy gate line GD1a and the 2a-th dummy gate line GD2a. The second opening OP2 of the first power supply electrode VDLb may be disposed so as not to overlap the first opening OP1 of the semiconductor pattern ACT. Further, the second opening OP2 of the first power supply electrode VDLb may be disposed so as not to overlap the third contact hole CH3.

The first power supply electrode VDLb may overlap the first opening OP1 of the semiconductor pattern ACT.

As illustrated in FIG. 3, the first power supply electrode VDLb may be disposed to be adjacent to the 1a-th area of the active area AA. The first power supply electrode VDLb may be disposed in the 3a-th area of the bezel area BA.

The first power supply electrode VDLb may be formed by the same process as the source electrode SE and the drain electrode DE of the thin film transistor TFT, on the same layer. The first power supply electrode VDLb may be formed of the same material as the source electrode SE and the drain electrode DE of the thin film transistor TFT.

The first opening OP1 of the semiconductor pattern ACT overlaps the 1a-th dummy gate line GD1a and the 2a-th dummy gate line GD2a and overlaps the first power supply electrode VDLb. Therefore, the area, where the first opening OP1 is formed, has a single compensation capacitor structure including only a first compensation component of the first compensation capacitance DC1. The first compensation capacitance DC1 may have a structure in which the 1a-th dummy gate line GD1a and the 2a-th dummy gate line GD2a overlap the first power supply electrode VDLb with the second interlayer insulating layer INT2 therebetween.

Further, the second opening OP2 of the first power supply electrode VDLb overlaps the semiconductor pattern ACT and overlaps the 1a-th dummy gate line GD1a and the 2a-th dummy gate line GD2a. Therefore, the area where the second opening OP2 is formed has a single compensation capacitor structure including only a second compensation component of the second compensation capacitance DC2. The second compensation capacitance DC2 may have a structure in which the 1a-th dummy gate line GD1a and the 2a-th dummy gate line GD2a overlap the semiconductor pattern ACT with the gate insulating layer GI and the first interlayer insulating layer INT1 therebetween.

A passivation layer PAS may be disposed on the first power supply electrode VDLb to protect the first power supply electrode VDLb.

At least one of the first planarizing layer PLN1, the second planarizing layer PLN2, and the encapsulation layer ENC may be formed on the passivation layer PAS.

The second compensating unit DCA2 may be formed to be similar to the first compensating unit DCA1 and formed by the same way as the first compensating unit DCA1, so that the description thereof will be omitted.

Figure 12:
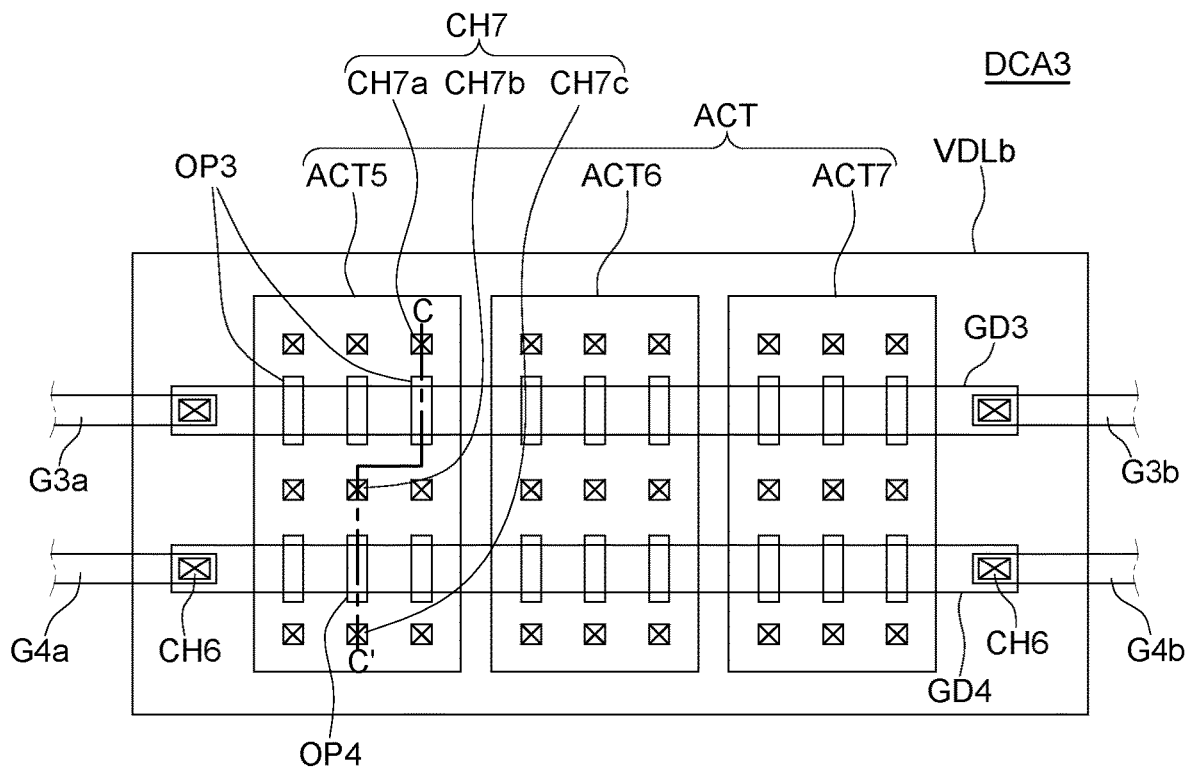
FIG. 12 is a plan view enlarging a partial area of a third compensating unit of FIG. 3 according to an exemplary embodiment of the present disclosure.
Figure 13:
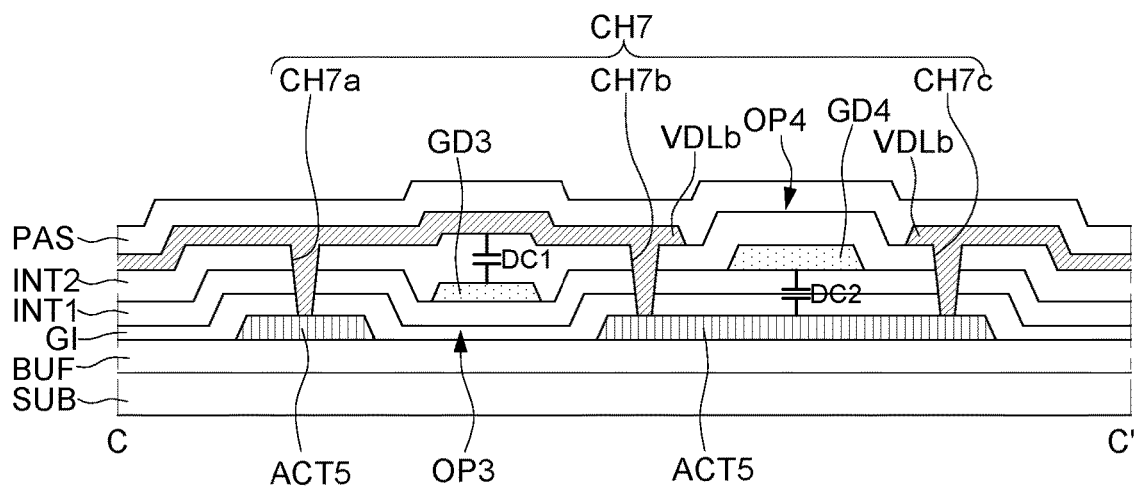
FIG. 13 is a cross-sectional view taken along line C-C' of FIG. 12 according to an exemplary embodiment of the present disclosure.

FIG. 12 is a plan view enlarging a partial area of a third compensating unit DCA3 of FIG. 3, and FIG. 13 is a cross-sectional view taken along line C-C' of FIG. 12. FIGS. 12 and 13 will be described with reference to FIGS. 3, 7, 8A, and 8B and a repeated portion may be omitted or briefly described.

Referring to FIG. 12, the third compensating unit DCA3 of the display panel 10 may include a buffer layer BUF disposed on the substrate SUB and a plurality of semiconductor patterns (for example, ACT5, ACT6, and ACT7) disposed on the buffer layer BUF. The semiconductor pattern ACT of the third compensating unit DCA3 may be formed by the same process as the semiconductor layer A of the thin film transistor TFT, on the same layer. The semiconductor pattern ACT of the third compensating unit DCA3 may be formed of the same material as the semiconductor layer A of the thin film transistor TFT. The semiconductor pattern ACT of the third compensating unit DCA3 may be a layer formed by making the semiconductor material conductive. The conduction of the semiconductor pattern ACT of the third compensating unit DCA3 may be performed together when the source area SA and the drain area DA of the semiconductor layer A of the thin film transistor TFT are made to be conductive. The gate insulating layer GI may be disposed on the buffer layer BUF to cover the semiconductor patterns ACT5, ACT6, and ACT7.

Referring to FIG. 12, a third dummy gate line GD3 and a fourth dummy gate line GD4 may be disposed to overlap the plurality of semiconductor patterns (for example ACT5, ACT6, and ACT7). In order to compensate the capacitance difference caused by the difference of the number of pixels in the 1a-th area of the first area having the free form portion in the active area AA and the number of pixels in the second area which does not have a free form portion, an overlapping area of the plurality of semiconductor patterns ACT5, ACT6, and ACT7 and the third dummy gate line GD3 and the fourth dummy gate line GD4 may vary.

For example, the overlapping area of the semiconductor pattern ACT and the third dummy gate line GD3 and the fourth dummy gate line GD4 may vary using the number or the size of the semiconductor pattern ACT. Further, the overlapping area of the semiconductor pattern ACT and the third dummy gate line GD3 and the fourth dummy gate line GD4 may vary by adjusting a width or a length of at least one of third dummy gate line GD3 and the fourth dummy gate line GD4.

Further, the overlapping area of the semiconductor pattern ACT and the third dummy gate line GD3 and the fourth dummy gate line GD4 may vary by forming a third opening OP3 in the semiconductor pattern ACT. For example, as illustrated in FIGS. 12 and 13, a partial area of the semiconductor pattern ACT which overlaps the third dummy gate line GD3 and the fourth dummy gate line GD4 is removed to form the third opening OP3. A width of the third opening OP3 may be formed to be larger than a width of the third dummy gate line GD3 and the fourth dummy gate line GD4.

Corresponding to a value of the capacitance for compensation, a width of the third opening OP3 may be formed to be smaller than the width of the third dummy gate line GD3 and the fourth dummy gate line GD4.

Referring to FIG. 12, the third opening OP3 is located in the semiconductor pattern ACT and a plurality of third openings OP3 may be formed.

Referring to FIG. 13, the gate insulating layer GI and the first interlayer insulating layer INT1 may be disposed on the buffer layer BUF to cover the semiconductor pattern ACT and the third opening OP3. Further, the third dummy gate line GD3 and the fourth dummy gate line GD4 may be disposed on the first interlayer insulating layer INT1 to overlap the semiconductor pattern ACT and the third opening OP3.

The third dummy gate line GD3 and the fourth dummy gate line GD4 may be formed by the same process as the second electrode C2 of the storage capacitor Cst, on the same layer. The third dummy gate line GD3 and the fourth dummy gate line GD4 may be formed of the same material as the second electrode C2 of the storage capacitor Cst.

Further, the second interlayer insulating layer INT2 may be disposed on the first interlayer insulating layer INT1 so as to cover the third dummy gate line GD3 and the fourth dummy gate line GD4.

The first power supply electrode VDLb which overlaps the third dummy gate line GD3 and the fourth dummy gate line GD4 may be disposed on the second interlayer insulating layer INT2. The first power supply electrode VDLb may be connected to the semiconductor patterns ACT5 and ACT6 through seventh and eighth contact holes CH7 and CH8 which pass through the second interlayer insulating layer INT2, the first interlayer insulating layer INT1, and the gate insulating layer GI to expose the semiconductor patterns ACT5 and ACT6. The first power supply electrode VDLb may overlap the plurality of semiconductor patterns ACT5, ACT6, and ACT7. The first power supply electrode VDLb may be disposed to be adjacent to the 1a-th area of the active area AA. The first power supply electrode VDLb may be disposed in the 3a-th area of the bezel area BA.

Further, a partial area of the first power supply electrode VDLb which overlaps the third dummy gate line GD3 and the fourth dummy gate line GD4 is removed to form a fourth opening OP4. A width of the fourth opening OP4 may be formed to be larger than a width of the third dummy gate line GD3 and the fourth dummy gate line GD4. Depending on the capacitance for compensation, a width of the fourth opening OP4 may be formed to be smaller than the width of the third dummy gate line GD3 and the fourth dummy gate line GD4. The fourth opening OP4 may be disposed to overlap the semiconductor pattern ACT.

Referring to FIG. 13, a seventh contact hole CH7 which passes through the second interlayer insulating layer INT2, the first interlayer insulating layer INT1, and the gate insulating layer GI to expose the semiconductor pattern ACT may be disposed on both sides of the third dummy gate line GD3 and the fourth dummy gate line GD4 and may be disposed so as not to overlap the third opening OP3. For example, a 7a-th contact hole CH7a and a 7b-th contact hole CH7b may be disposed on both sides of the third dummy gate line GD3 and the 7b-th contact hole CH7b and a 7c-th contact hole CH7c may be disposed on both sides of the fourth dummy gate line GD4. Further, the 7a-th contact hole CH7a, the 7b-th contact hole CH7b, and the 7c-th contact hole CH7c may be disposed so as not to overlap the third opening OP3 of the semiconductor pattern ACT.

The fourth opening OP4 of the first power supply electrode VDLb may be disposed to overlap the third dummy gate line GD3 and the fourth dummy gate line GD4. The fourth opening OP4 of the first power supply electrode VDLb may be disposed so as not to overlap the third opening OP3 of the semiconductor pattern ACT. Further, the fourth opening OP4 of the first power supply electrode VDLb may be disposed so as not to overlap the seventh contact hole CH7.

The first power supply electrode VDLb may overlap the third opening OP3 of the semiconductor pattern ACT.

The third opening OP3 of the semiconductor pattern ACT overlaps the third dummy gate line GD3 and the fourth dummy gate line GD4 and overlaps the first power supply electrode VDLb. Therefore, the area where the third opening OP3 is formed has a single compensation capacitor structure including only a first compensation component of the first compensation capacitance DC1. The first compensation capacitance DC1 may have a structure in which the third dummy gate line GD3 and the fourth dummy gate line GD4 overlap the first power supply electrode VDLb with the second interlayer insulating layer INT2 therebetween.

Further, the fourth opening OP4 of the first power supply electrode VDLb overlaps the semiconductor pattern ACT and overlaps the third dummy gate line GD3 and the fourth dummy gate line GD4. Therefore, the area where the fourth opening OP4 is formed has a single compensation capacitor structure including only a second compensation component of the second compensation capacitance DC2. The second compensation capacitance DC2 may have a structure in which the third dummy gate line GD3 and the fourth dummy gate line GD4 overlap the semiconductor pattern ACT with the first interlayer insulating layer INT1 therebetween.

A passivation layer PAS may be disposed on the first power supply electrode VDLb to protect the first power supply electrode VDLb. Further, at least one of the first planarizing layer PLN1, the second planarizing layer PLN2, and the encapsulation layer ENC may be formed on the passivation layer PAS.

The first compensating unit DCA1 according to the above-described configuration may include, as illustrated in FIGS. 5, 6A, and 6B, a first compensation component of first compensating capacitances DC1 formed by each dummy gate line GD1a or GD2a and the first power supply electrode VDLb and a second compensation component of second compensating capacitances DC2 formed by each dummy gate line GD1a or GD2a and the plurality of semiconductor patterns ACT1, ACT2, and ACT3.

Similarly to the first compensating unit DCA1, the second compensating unit DCA2 may include a first compensation component of first compensating capacitances DC1 formed by each dummy gate line GD1b or GD2b and the first power supply electrode VDLb and a second compensation component of second compensating capacitances DC2 formed by each dummy gate line GD1b or GD2b and the plurality of semiconductor patterns.

The third compensating unit DCA3 may include, as illustrated in FIGS. 7, 8A, and 8B, a first compensation component of first compensating capacitances DC1 formed by each dummy gate line GD3 or GD4 and the first power supply electrode VDLb and a second compensation component of second compensating capacitances DC2 formed by each dummy gate line GD3 or GD4 and the plurality of semiconductor patterns ACT5, ACT6 and ACT7.

Therefore, in the display apparatus according to the exemplary embodiment of the present disclosure, the display panel 10 may maximize a compensation capacitance in a limited space of the 3a-th area of the bezel area BA located to be adjacent to the first and second sub active areas, by means of the first compensating unit DCA1 and the second compensating unit DCA2 having a double compensation capacitor structure of the first capacitance C1 and the second capacitance C2. Further, the third compensating unit DCA3 also has the double compensation capacitor structure, similar to the first compensating unit DCA1, so that the compensation capacitance may be maximized in the limited space of the 3a-th area located to be adjacent to the notch portion NO of the active area AA. For example, the third compensating unit DCA3 also has the double compensation capacitor structure similar to the first compensating unit DCA1, so that the compensation capacitance may be maximized in the 3a-th area of the bezel area BA corresponding to an area between the first and second sub active areas. Therefore, the R-C load per pixel line may be increased by the first compensating unit DCA1, the second compensating unit DCA2, and the third compensating unit DCA3 located in the 3a-th area of the bezel area to be compensated to be close to the R-C load per pixel line disposed in the second area which is a non-free form portion of the active area AA. Therefore, the luminance nonuniformity of the display panel may be improved.

Figure 14:
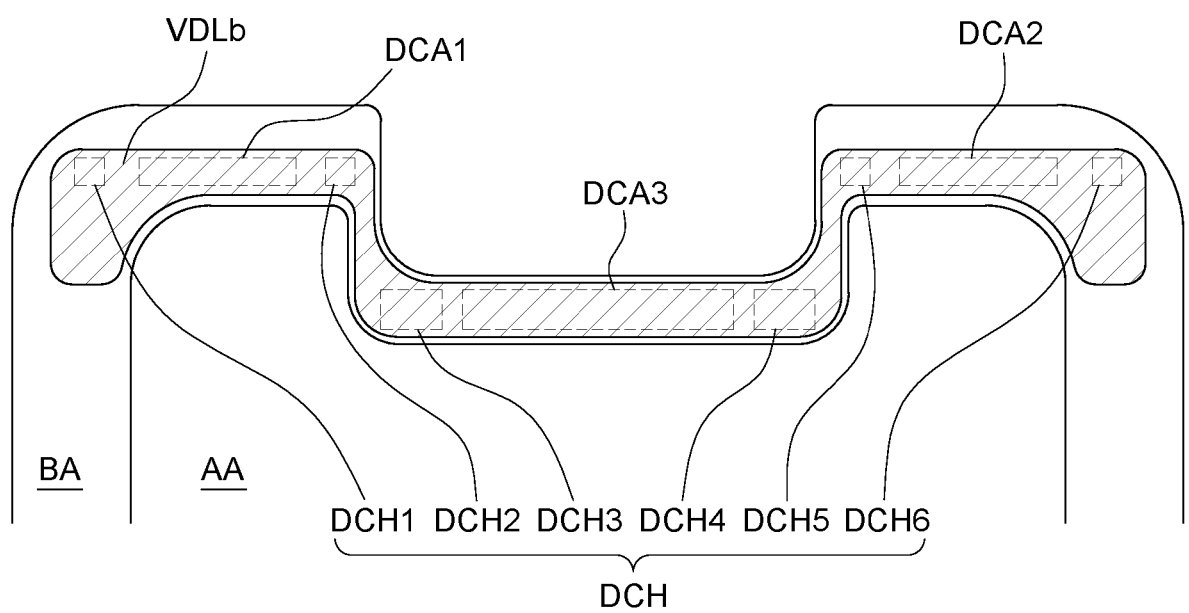
FIG. 14 is a plan view schematically illustrating R1 illustrated in FIG. 2 according to an exemplary embodiment of the present disclosure.
Figure 15:
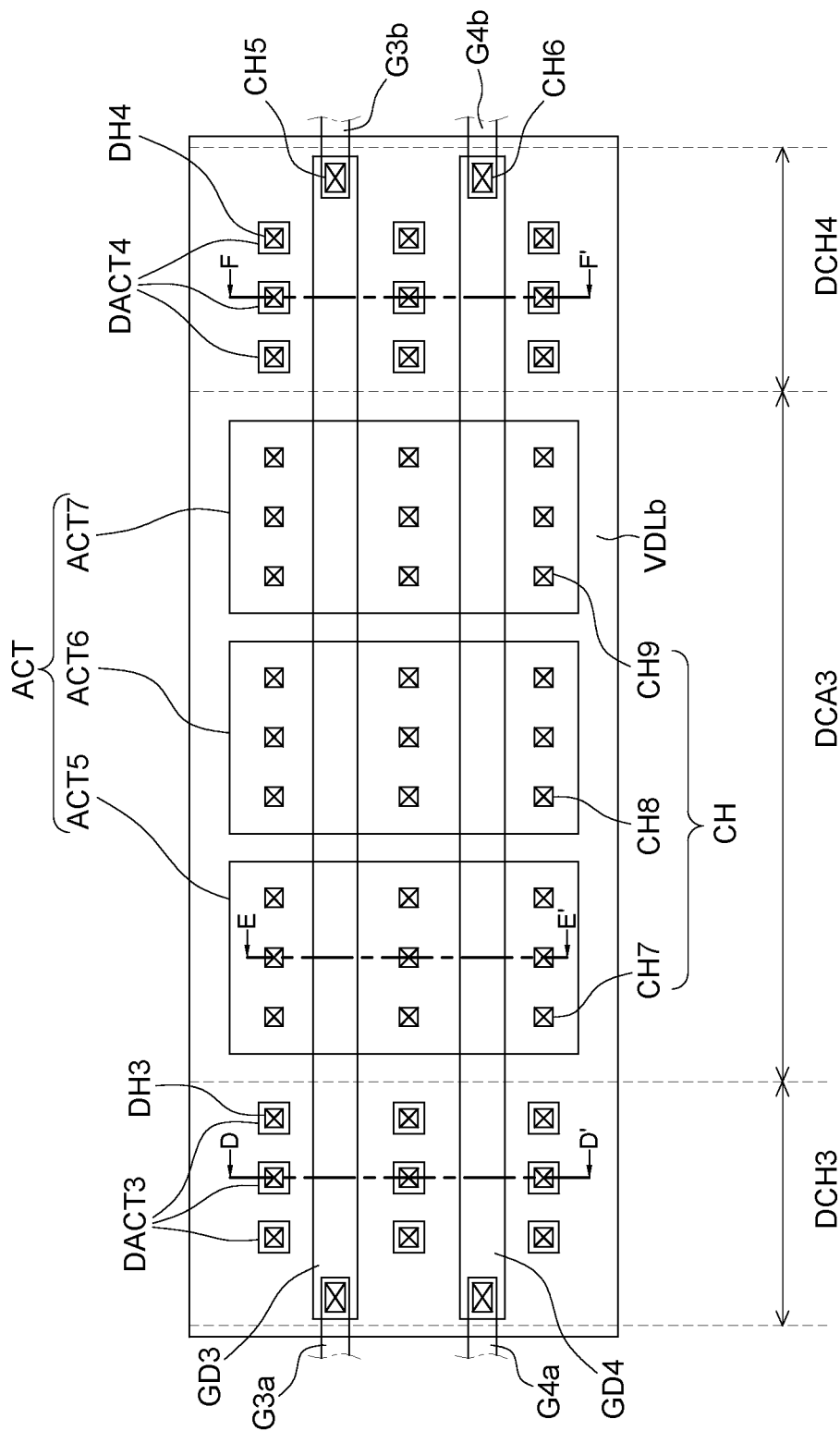
FIG. 15 is a plan view enlarging areas of a third compensating unit, a third dummy contact unit, and a fourth dummy contact unit of FIG. 14 according to an exemplary embodiment of the present disclosure.
Figure 16A:
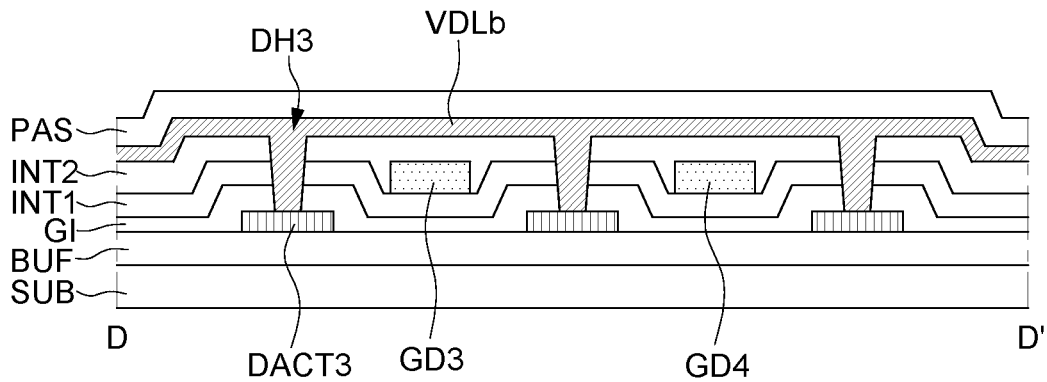
FIG. 16A is a cross-sectional view taken along the line D-D' of FIG. 15 according to an exemplary embodiment of the present disclosure.
Figure 16B:
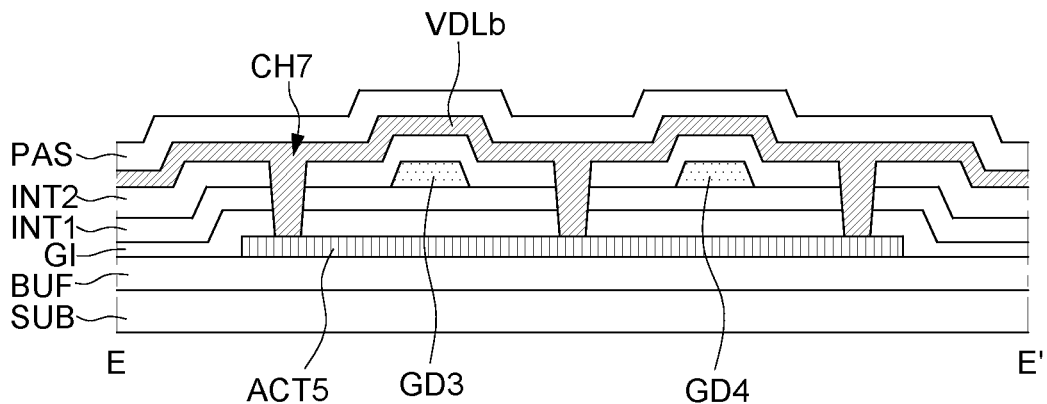
FIG. 16B is a cross-sectional view taken along line E-E' of FIG. 15 according to an exemplary embodiment of the present disclosure.
Figure 16C:
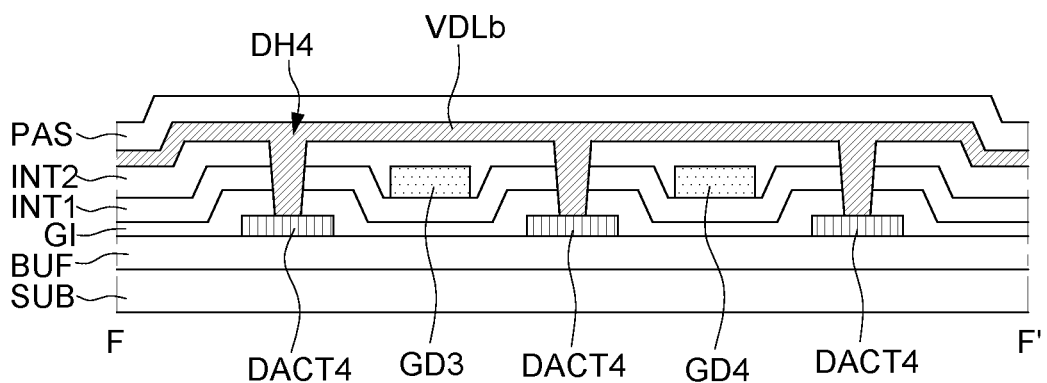
FIG. 16C is a cross-sectional view taken along line F-F' of FIG. 15 according to an exemplary embodiment of the present disclosure.
Figure 17:
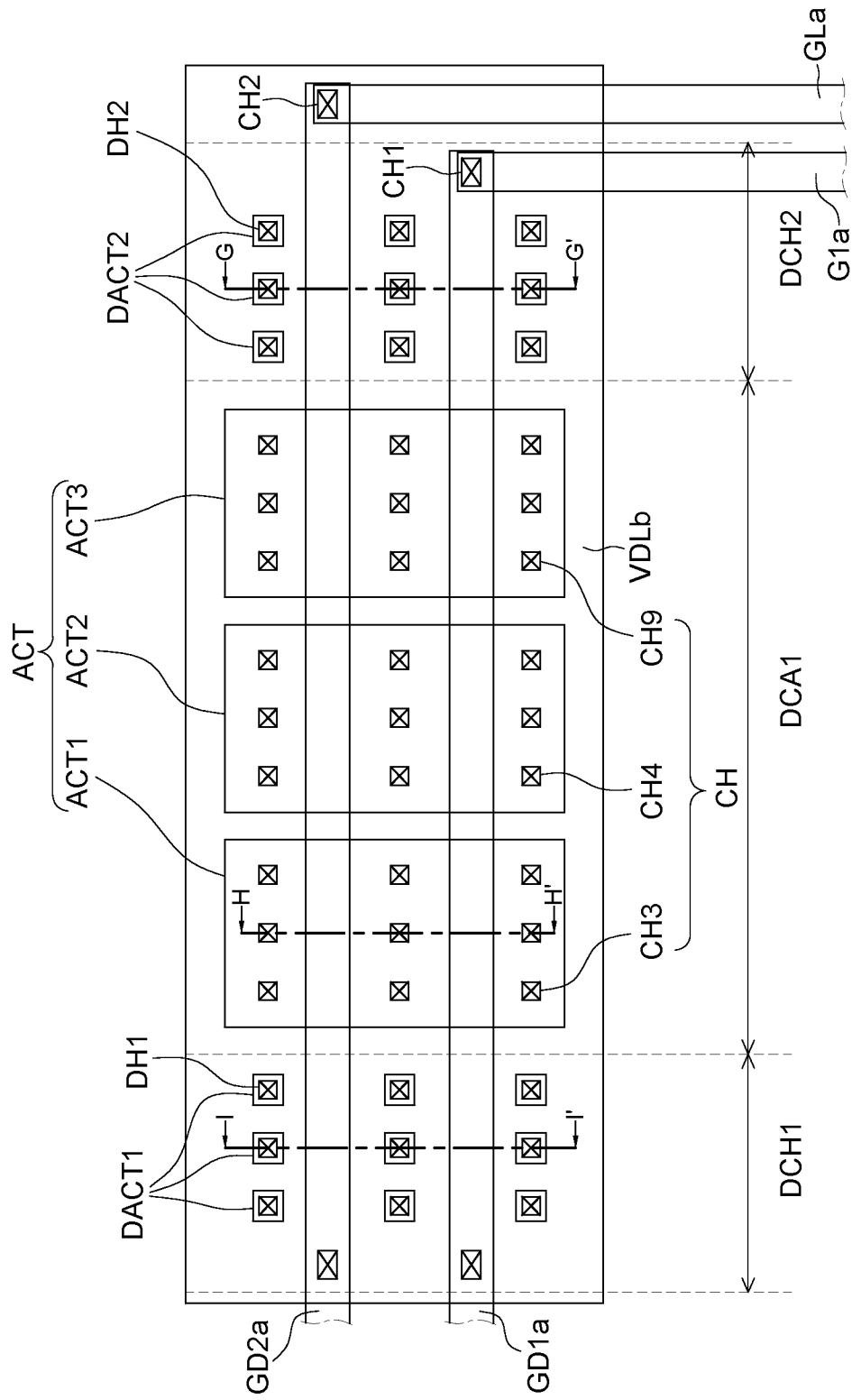
FIG. 17 is a plan view enlarging areas of a first compensating unit, a first dummy contact unit, and a second dummy contact unit of FIG. 14 according to an exemplary embodiment of the present disclosure.
Figure 18A:
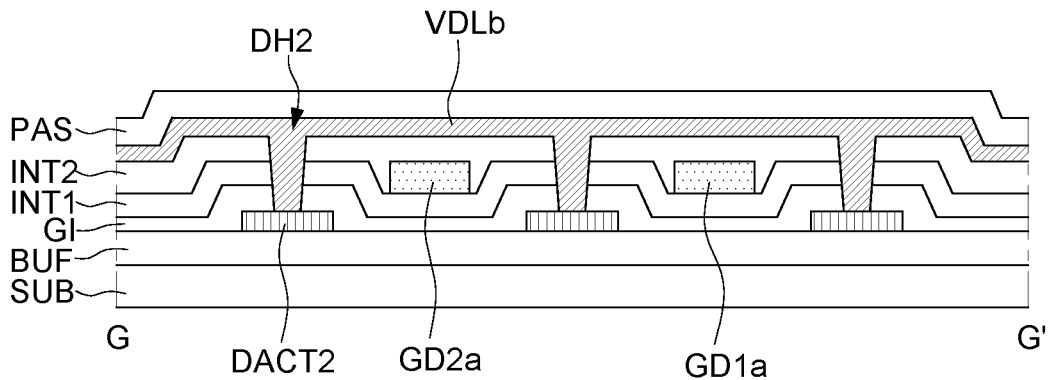
FIG. 18A is a cross-sectional view taken along the line G-G' of FIG. 17 according to an exemplary embodiment of the present disclosure.
Figure 18B:
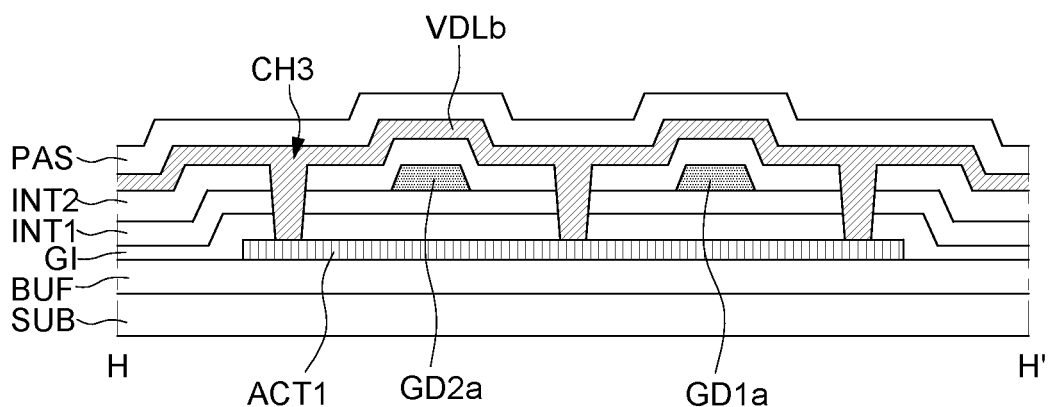
FIG. 18B is a cross-sectional view taken along line H-H' of FIG. 17 according to an exemplary embodiment of the present disclosure.
Figure 18C:
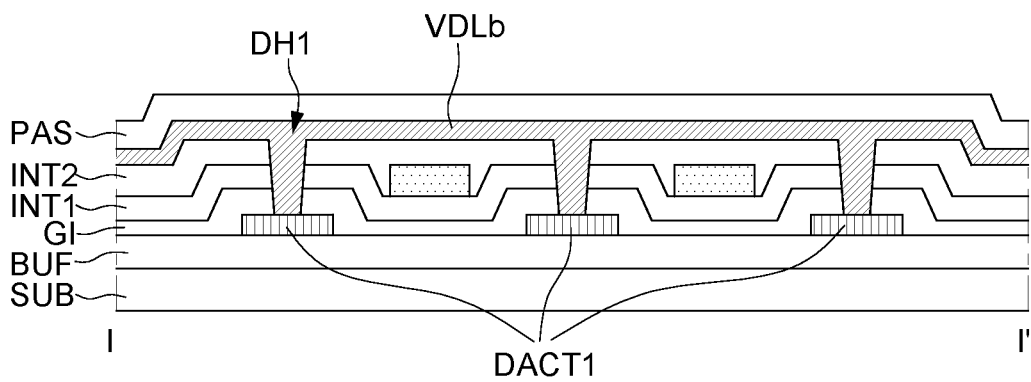
FIG. 18C is a cross-sectional view taken along line I-I' of FIG. 17 according to an exemplary embodiment of the present disclosure.

FIG. 14 is a plan view schematically illustrating R1 illustrated in FIG. 2. FIG. 15 is a plan view enlarging areas of a third compensating unit, a third dummy contact unit, and a fourth dummy contact unit of FIG. 14. FIG. 16A is a cross-sectional view taken along the line D-D' of FIG. 15. FIG. 16B is a cross-sectional view taken along line E-E' of FIG. 15. FIG. 16C is a cross-sectional view taken along line F-F' of FIG. 15. FIG. 17 is a plan view enlarging areas of a first compensating unit, a first dummy contact unit, and a second dummy contact unit of FIG. 14. FIG. 18A is a cross-sectional view taken along the line G-G' of FIG. 17. FIG. 18B is a cross-sectional view taken along line H-H' of FIG. 17. FIG. 18C is a cross-sectional view taken along line I-I' of FIG. 17. FIG. 14 will be described with reference to FIG. 3 and description of a repeated portion will be omitted or briefly described. FIG. 15 will be described with reference to FIG. 7, FIG. 17 will be described with reference to FIG. 5 and description of a repeated portion will be omitted or briefly described.

Referring to FIG. 14, in order to compensate the luminance nonuniformity of the first area of the active area AA and the second area of the active area AA, at least one of first to third compensating units DCA1 to DCA3 may be disposed in the third area of the bezel area BA. Further, at least one of first to sixth dummy contact units DCH1 to DCH6 may be disposed in the third area of the bezel area BA adjacent to a curved portion RO having a round shape in the first area of the active area AA.

Referring to FIG. 14, the 1a-th area of the active area AA may include first and second sub active areas which are divided into the left and the right by the notch portion NO in the display panel 10.

The display panel 10 according to the exemplary embodiment of the present disclosure may include the active area AA and the bezel area BA. The active area AA may include a first area having a free form portion and a second area which does not have a free form portion. The first area may include a 1a-th area including a notch portion NO and a curved portion RO, and a 1b-th area including a curved portion RO. The bezel area BA is located to be adjacent to the active area AA and disposed to enclose the active area AA. The bezel area BA may include a third area having a free form portion and a fourth area which does not have a free form portion. The third area may include a 3a-th area including a notch portion NO and a curved portion RO, and a 3b-th area including a curved portion RO. The 3a-th area of the bezel area BA may be disposed to be adjacent to the 1a-th area of the active area AA, and the 3b-th area of the bezel area BA may be disposed to be adjacent to the 1b-th area of the active area AA. Further, the 3a-th area of the bezel area BA may have the free form portion having a shape corresponding to that of the 1a-th area of the active area AA, and the 3b-th area of the bezel area BA may have the free form portion having a shape corresponding to that of the 1b-th area of the active area AA.

In FIG. 14, the 1a-th area of the active area AA and the 3a-th area of the bezel area BA will be described. For the simplification of description, in FIG. 14, the first power source lines VD1 to VDm, the gate lines G1 to Gn, and the data lines D1 to Dm disposed in the active area AA of FIG. 2 will be omitted.

The display panel 10 may include a first compensating unit DCA1 formed by overlapping the 1a-th and 2a-th dummy gate lines GD1$a$ and GD2$a$ disposed in the first compensation area located at the left side of the 3a-th area of the third area and the first power supply electrode VDLb and a second compensating unit DCA2 formed by overlapping the 1b-th and 2b-th dummy gate lines GD1$b$ and GD2$b$ disposed in the second compensation area located at the right side of the 3a-th area and the first power supply electrode VDLb. The display panel 10 may include the third compensating unit DCA3 which is formed by overlapping the third and fourth gate lines GD3 and GD4 disposed in the third compensation area at the center of the 3a-th area and the first power supply electrode VDLb. For example, the 1a-th area of the active area AA may include first and second sub active areas which are divided to the left and the right by the notch portion NO. The first compensating unit DCA1 may be disposed in the bezel area BA adjacent to the first sub active area located at the left side of the 1a-th area. Further, the second compensating unit DCA2 may be disposed in the bezel area BA adjacent to the second sub active area located at the right side of the 1a-th area. The third compensating unit DCA3 may be disposed in the bezel area BA adjacent to the notch portion NO of the 1a-th area.

Referring to FIG. 14, the third compensating unit DCA3 may be disposed in the third area of the bezel area BA located between the first sub active area and the second sub active area. The third dummy contact unit DCH3 may be disposed in the third area of the bezel area BA located between the first sub active area and the third compensating unit DCA3. Further, the fourth dummy contact unit DCH4 may be disposed in the third area of the bezel area BA located between the third compensating unit DCA3 and the second sub active area.

As illustrated in FIG. 14, the display apparatus according to the exemplary embodiment of the present disclosure may have first to sixth dummy contact units DCH1 to DCH6 in the bezel area BA adjacent to the curved portion RO having a round shape in the 1a-th area of the active area AA. For example, the first dummy contact unit DCH1 and the second dummy contact unit DCH2 may be disposed in the bezel area BA adjacent to the curved portion RO of the first sub active area located at the left side of the 1a-th area. Further, the fifth dummy contact unit DCH5 and the sixth dummy contact unit DCH6 may be disposed in the bezel area BA adjacent to the curved portion RO of the second sub active area located at the right side of the 1a-th area. Further, the third dummy contact unit DCH3 and the fourth dummy contact unit DCH4 may be disposed in the bezel area BA adjacent to the curved portion RO disposed in the notch portion NO of the 1a-th area. In the display apparatus according to the exemplary embodiment of the present disclosure, the dummy contact unit may also be disposed in the bezel area BA adjacent to the curved portion RO having a round shape in the 1b-th area of the active area AA. Like the display apparatus according to the exemplary embodiment of the present disclosure as stated above, in order to compensate the luminance nonuniformity generated in the free form portion of the display panel 10, the compensating unit may be disposed in the bezel area BA corresponding to the free form portion. Further, a contact hole may be disposed in the compensating unit to ensure the capacitance. The inventor of the present disclosure found out that, when the contact hole is formed only in a specific area of the bezel area BA where the compensating unit is disposed, a time to charge the voltage for each of pixels P in the active area AA is changed. Further, it is confirmed that, since the time to charge the voltage in each of pixels P varies, the luminance nonuniformity is generated in the free form portion of the active area AA. The inventor of the present disclosure further found out that the luminance of the pixel P is affected by the number density of the contact hole disposed in the bezel area BA. Further, it is confirmed that the luminance nonuniformity is also easily generated at a curved portion RO having a round shape in the active area AA. The density or number density of a hole or contact hole as used herein may refer to a number of holes or contact holes formed in a unit of area, for example, an area of 1 mm×1 mm, but the present disclosure is not limited thereto.

In the display apparatus according to the exemplary embodiment of the present disclosure, a dummy hole is formed in the bezel area BA adjacent to the curved portion RO of the active area AA to reduce the luminance nonuniformity generated in the display panel 10 due to the number density nonuniformity of the hole.

Next, the third compensating unit DCA3, the third dummy contact unit DCH3, and the fourth dummy contact unit DCH4 disposed in the bezel area BA of the display panel 10 will be described in more detail with reference to FIGS. 15, 16A, 16B, and 16C. FIG. 15 is a plan view enlarging areas of a third compensating unit DCA3, a third dummy contact unit DCH3, and a fourth dummy contact unit DCH4 of FIG. 14. FIG. 16A is a cross-sectional view of the D-D' line in an area corresponding to the third dummy contact unit DCH3 of FIG. 15. FIG. 16B is a cross-sectional view of the E-E' line in an area corresponding to the third compensating unit DCA3 of FIG. 15. FIG. 16C is a cross-sectional view of the F-F line in an area corresponding to the fourth dummy contact unit DCH4 of FIG. 15.

Referring to FIGS. 15, 16A, 16B, and 16C, the third dummy contact unit DCH3, the third compensating unit DCA3, and the fourth dummy contact unit DCH4 disposed in the 3a-th area of the bezel area BA include the buffer layer BUF on the substrate SUB and the semiconductor pattern ACT and the dummy semiconductor patterns DACT3 and DACT4 disposed on the buffer layer BUF. The semiconductor pattern ACT of the third compensating unit DCA3, the third dummy semiconductor pattern DACT3 of the third dummy contact unit DCH3, and the fourth dummy semiconductor pattern DACT4 of the fourth dummy contact unit DCH4 may be disposed on the same layer as the semiconductor layer A of the thin film transistor TFT and formed of the same material.

The gate insulating layer GI may be disposed on the buffer layer BUF to cover the semiconductor pattern ACT and the dummy semiconductor patterns DACT3 and DACT4.

The first interlayer insulating layer INT1 may be disposed on the gate insulating layer GI.

The third dummy gate line GD3, which connects a 3a-th gate line G3a and a 3b-th gate line G3b which are spaced apart from each other, may be disposed on the first interlayer insulating layer INT1. Further, a fourth dummy gate line GD4, which connects a 4a-th gate line G4a and a 4b-th gate line G4b, may be disposed. The third dummy gate line GD3 and the fourth dummy gate line GD4 may be disposed on the same layer as the second electrode C2 of the storage capacitor Cst and formed of the same material.

Referring to FIGS. 16A and 16C, the third dummy gate line GD3 and the fourth dummy gate line GD4 are disposed so as not to overlap the dummy semiconductor patterns DACT3 and DACT4. For example, the third dummy gate line GD3 and the fourth dummy gate line GD4 may be disposed so as not to overlap the third dummy semiconductor pattern DACT3 of the third dummy contact unit DCH3 and the fourth dummy semiconductor pattern DACT4 of the fourth dummy contact unit DCH4. Referring to FIG. 16B, the semiconductor pattern ACT of the third compensating unit DCA3 disposed on the buffer layer BUF may be formed so as to overlap the third dummy gate line GD3 and the fourth dummy gate line GD4. The semiconductor pattern ACT may be formed of a plurality of patterns. At least one semiconductor pattern ACT among the plurality of semiconductor patterns ACT may overlap both the third dummy gate line GD3 and the fourth dummy gate line GD4. For example, referring to FIGS. 15 and 16B, a fifth semiconductor pattern ACT5, which is one of the plurality of semiconductor patterns ACT, overlaps both the third dummy gate line GD3 and the fourth dummy gate line GD4. However, as illustrated in FIG. 15, each of the third dummy semiconductor pattern DACT3 and the fourth dummy semiconductor pattern DACT4 is disposed so as not to overlap the third dummy gate line GD3 and the fourth dummy gate line GD4.

Referring to FIGS. 16A, 16B, and 16C, the second interlayer insulating layer INT2 may be disposed on the first interlayer insulating layer INT1 to cover the third dummy gate line GD3 and the fourth dummy gate line GD4. Further, the gate insulating layer GI, the first interlayer insulating layer INT1, and the second interlayer insulating layer INT2 may include an opening which exposes the semiconductor pattern ACT and the dummy semiconductor patterns DACT3 and DACT4. For example, the gate insulating layer GI, the first interlayer insulating layer INT1, and the second interlayer insulating layer INT2 disposed on the semiconductor pattern ACT, the third dummy semiconductor pattern DACT3, and the fourth dummy semiconductor pattern DACT4 may include a contact hole CH which exposes an upper surface of the semiconductor pattern ACT, a third dummy hole DH3 which exposes an upper surface of the third dummy semiconductor pattern DACT3, and a fourth dummy hole DH4 which exposes an upper surface of the fourth dummy semiconductor pattern DACT4. As illustrated in FIG. 15, a plurality of third dummy semiconductor patterns DACT3 may overlap a plurality of third dummy holes DH3, respectively. Further, the plurality of fourth dummy semiconductor patterns DACT4 may overlap the plurality of fourth dummy holes DH4, respectively. Further, the dummy holes DH3 and DH4 may be disposed in the dummy contact units DCH3 and DCH4 with the same density as the contact hole CH disposed in the third compensating unit DCA3. The semiconductor pattern ACT of the third compensating unit DCA3 may be formed to overlap the plurality of contact holes CH. The semiconductor pattern ACT may be formed of a plurality of patterns. At least one semiconductor pattern ACT among the plurality of semiconductor patterns ACT overlaps at least two contact holes CH. For example, referring to FIGS. 15 and 16B, the fifth semiconductor pattern ACT5 which is one of the plurality of semiconductor patterns ACT may overlap at least two seventh contact holes CH7. Referring to FIGS. 15, 16A, and 16C, the plurality of dummy semiconductor patterns DACT4 and DACT3 may overlap the plurality of dummy holes DH3 and DH4 with one-to-one correspondence. The plurality of third dummy semiconductor patterns DACT3 may overlap the plurality of third dummy holes DH3 with one-to-one correspondence. Further, the plurality of fourth dummy semiconductor patterns DACT4 may overlap the plurality of fourth dummy holes DH4 with one-to-one correspondence.

One pattern of the plurality of dummy semiconductor patterns DACT4 and DACT3 has a smaller area than that of one pattern of the plurality of semiconductor patterns ACT. For example, an area of the third dummy semiconductor pattern DACT3 disposed in the third dummy contact unit DCH3 is smaller than an area of the fifth semiconductor pattern ACT5 disposed in the third compensating unit DCA3.

The first power supply electrode VDLb which overlaps the semiconductor pattern ACT, the third dummy semiconductor pattern DACT3 and the fourth dummy semiconductor pattern DACT4 may be disposed on the second interlayer insulating layer INT2. The first power supply electrode VDLb may overlap the third dummy gate line GD3 and the fourth dummy gate line GD4.

The first power supply electrode VDLb may be connected to the semiconductor patterns ACT through a contact hole CH of the second interlayer insulating layer INT2, the first interlayer insulating layer INT1, and the gate insulating layer GI which expose the semiconductor pattern ACT. The first power supply electrode VDLb may be connected to the plurality of semiconductor patterns ACT. Further, the first power supply electrode VDLb may be connected to the dummy semiconductor patterns DACT3 and DACT4 through dummy holes DH3 and DH4 of the second interlayer insulating layer INT2, the first interlayer insulating layer INT1, and the gate insulating layer GI which expose the dummy semiconductor patterns DACT3 and DACT4. For example, as illustrated in FIGS. 16A and 16C, the third dummy semiconductor pattern DACT3 may be connected to the first power supply electrode VDLb through the third dummy hole DH3. The fourth dummy semiconductor pattern DACT4 may be connected to the first power supply electrode VDLb through the fourth dummy hole DH4. Further, referring to FIG. 16B, the fifth semiconductor pattern ACT5 may be connected to the first power supply electrode VDLb through the seventh contact hole CH7.

The first power supply electrode VDLb may be disposed to be adjacent to the 1a-th area of the active area AA. The first power supply electrode VDLb may be disposed in the 3a-th area of the bezel area BA. The first power supply electrode VDLb may be disposed on the same layer as the source electrode SE and the drain electrode DE of the thin film transistor TFT and may be formed of the same material.

A passivation layer PAS may be disposed on the first power supply electrode VDLb to protect the first power supply electrode VDLb.

Next, the first compensating unit DCA1, the first dummy contact unit DCH1, and the second dummy contact unit DCH2 disposed in the bezel area BA of the display panel 10 will be described in more detail with reference to FIGS. 17, 18A to 18C. FIG. 17 is a plan view enlarging areas of a first compensating unit DCA1, a first dummy contact unit DCH1, and a second dummy contact unit DCH2 of FIG. 14. FIG. 18A is a cross-sectional view of the G-G' line in an area corresponding to the second dummy contact unit DCH2 of FIG. 17. FIG. 18B is a cross-sectional view of the H-H' line in an area corresponding to the first compensating unit DCA1 of FIG. 17. FIG. 18C is a cross-sectional view of the I-I' line in an area corresponding to the first dummy contact unit DCH1 of FIG. 17.

Referring to FIGS. 17, 18A to 18C, the first dummy contact unit DCH1, the first compensating unit DCA1, and the second dummy contact unit DCH2 disposed in the 3a-th area of the bezel area BA include the buffer layer BUF on the substrate SUB and the semiconductor pattern ACT and the dummy semiconductor patterns DACT1 and DACT2 disposed on the buffer layer BUF. The semiconductor pattern ACT of the first compensating unit DCA1, the first dummy semiconductor pattern DACT1 of the first dummy contact unit DCH1, and the second dummy semiconductor pattern DACT2 of the second dummy contact unit DCH2 may be disposed on the same layer as the semiconductor layer A of the thin film transistor TFT and formed of the same material.

The gate insulating layer GI may be disposed on the buffer layer BUF to cover the semiconductor pattern ACT and the dummy semiconductor patterns DACT1 and DACT2.

The first interlayer insulating layer INT1 may be disposed on the gate insulating layer GI.

The 2a-th dummy gate line GD2a connected to the 2a-th gate line G2a and the 1a-th dummy gate line GD1a connected to the 1a-th gate line G1a may be disposed on the first interlayer insulating layer INT1. The 1a-th dummy gate line GD1a and the 2a-th dummy gate line GD2a may be disposed on the same layer as the second electrode C2 of the storage capacitor Cst and may be formed of the same material.

Referring to FIGS. 18A and 18C, the 1a-th dummy gate line GD1a and the 2a-th dummy gate line GD2a are disposed so as not to overlap the dummy semiconductor patterns DACT1 and DACT2. For example, the 1a-th dummy gate line GD1a and the 2a-th dummy gate line GD2a may be disposed so as not to overlap the first dummy semiconductor pattern DACT1 disposed in the first dummy contact unit DCH1 and the second dummy semiconductor pattern DACT2 disposed in the second dummy contact unit DCH2.

Referring to FIG. 18B, the semiconductor pattern ACT of the first compensating unit DCA1 disposed on the buffer layer BUF may be disposed so as to overlap the 1a-th dummy gate line GD1a and the 2a-th dummy gate line GD2a. The semiconductor pattern ACT may be formed of a plurality of patterns. At least one semiconductor pattern ACT among the plurality of semiconductor patterns ACT may overlap both the 1a-th dummy gate line GD1a and the 2a-th dummy gate line GD2a. For example, referring to FIGS. 17 and 18B, a first semiconductor pattern ACT1 which is one of the plurality of semiconductor patterns ACT overlaps both the 1a-th dummy gate line GD1a and the 2a-th dummy gate line GD2a. However, as illustrated in FIG. 17, each of the plurality of the first dummy semiconductor pattern DACT1 and the plurality of the second dummy semiconductor pattern DACT2 is disposed so as not to overlap the 1a-th dummy gate line GD1a and the 2a-th dummy gate line GD2a.

Referring to FIG. 18A to 18C, the second interlayer insulating layer INT2 may be disposed on the first interlayer insulating layer INT1 so as to cover the 1a-th dummy gate line GD1a and the 2a-dummy gate line GD2a.

Further, the gate insulating layer GI, the first interlayer insulating layer INT1, and the second interlayer insulating layer INT2 may include an opening which exposes the semiconductor pattern ACT and the dummy semiconductor patterns DACT1 and DACT2. For example, the gate insulating layer GI, the first interlayer insulating layer INT1, and the second interlayer insulating layer INT2 disposed on the semiconductor pattern ACT, the first dummy semiconductor pattern DACT1, and the second dummy semiconductor pattern DACT2 may include a contact hole CH which exposes an upper surface of the semiconductor pattern ACT, a first dummy hole DH1 which exposes an upper surface of the first dummy semiconductor pattern DACT1, and a second dummy hole DH2 which exposes an upper surface of the second dummy semiconductor pattern DACT2. As illustrated in FIG. 17, a plurality of first dummy semiconductor patterns DACT1 may overlap a plurality of first dummy holes DH1, respectively. Further, the plurality of second dummy semiconductor patterns DACT2 may overlap the plurality of second dummy holes DH2, respectively. Further, the dummy holes DH1 and DH2 may be disposed in the dummy contact units DCH1 and DCH2 with the same density as the contact hole CH disposed in the first compensating unit DCA1. The semiconductor pattern ACT of the first compensating unit DCA1 may be formed to overlap the plurality of contact holes CH. The semiconductor pattern ACT may be formed of a plurality of patterns. At least one semiconductor pattern ACT among the plurality of semiconductor patterns ACT overlaps at least two contact holes CH. For example, referring to FIGS. 17 and 18B, the first semiconductor pattern ACT1 which is one of the plurality of semiconductor patterns ACT may overlap at least two seventh contact holes CH7 in the first compensating unit DCA1. Referring to FIGS. 17, 18A, and 18C, the plurality of dummy semiconductor patterns DACT1 and DACT2 may overlap the plurality of dummy holes DH1 and DH2 with one-to-one correspondence, respectively. The plurality of first dummy semiconductor patterns DACT1 may overlap the plurality of first dummy holes DH1 with one-to-one correspondence. Further, the plurality of second dummy semiconductor patterns DACT2 may overlap the plurality of second dummy holes DH2 with one-to-one correspondence.

One pattern of the plurality of dummy semiconductor patterns DACT1 and DACT2 has a smaller area than that of one pattern of the plurality of semiconductor patterns ACT. For example, an area of the first dummy semiconductor pattern DACT1 disposed in the first dummy contact unit DCH1 is smaller than an area of the first semiconductor pattern ACT1 disposed in the first compensating unit DCA1.

The first power supply electrode VDLb which overlaps the semiconductor pattern ACT, the first dummy semiconductor pattern DACT1 and the second dummy semiconductor pattern DACT2 may be disposed on the second interlayer insulating layer INT2. The first power supply electrode VDLb may overlap the 1a-th dummy gate line GD1a and the 2a-th dummy gate line GD2a.

The first power supply electrode VDLb may be connected to the semiconductor patterns ACT through contact holes CH of the second interlayer insulating layer INT2, the first interlayer insulating layer INT1, and the gate insulating layer GI which expose the semiconductor pattern ACT. The first power supply electrode VDLb may be connected to the plurality of semiconductor patterns ACT. Further, the first power supply electrode VDLb may be connected to the dummy semiconductor patterns DACT1 and DACT2 through dummy holes DH1 and DH2 of the second interlayer insulating layer INT2, the first interlayer insulating layer INT1, and the gate insulating layer GI which expose the dummy semiconductor patterns DACT1 and DACT2. For example, as illustrated in FIGS. 18A and 18C, the first dummy semiconductor pattern DACT1 may be connected to the first power supply electrode VDLb through the first dummy hole DH1. The second dummy semiconductor pattern DACT2 may be connected to the first power supply electrode VDLb through the second dummy hole DH2. Further, referring to FIG. 18B, the first semiconductor pattern ACT1 may be connected to the first power supply electrode VDLb through the third contact hole CH3.

The first power supply electrode VDLb may be disposed in the bezel area BA adjacent to the 1a-th area of the active area AA. The first power supply electrode VDLb may be disposed in the 3a-th area of the bezel area BA. The first power supply electrode VDLb may be disposed on the same layer as the source electrode SE and the drain electrode DE of the thin film transistor TFT and may be formed of the same material.

A passivation layer PAS may be disposed on the first power supply electrode VDLb to protect the first power supply electrode VDLb.

The second compensating unit DCA2 may be formed to be similar to the first compensating unit DCA1 and formed by the same way as the first compensating unit DCA1, so that the same description will be omitted. Further, the fifth dummy contact unit DCH5 and the sixth dummy contact unit DCH6 are formed to be similar to the first dummy contact unit DCH1 and the second dummy contact unit DCH2 and formed by the same way as the first dummy contact unit DCH1 and the second dummy contact unit DCH2, so that the same description will be omitted.

In order to compensate the luminance nonuniformity generated in the free form portion of the display panel 10 having a free form portion according to the exemplary embodiment of the present disclosure, at least one compensating unit DCA1 to DCA3 may be disposed in the third area of the bezel area BA corresponding to the free form portion of the display panel 10. In the compensating units DCA1 to DCA3, a plurality of contact holes CH may be disposed to ensure the compensation capacitance. Further, the contact hole CH disposed in the third area of the bezel area BA is disposed only in the compensating units DCA1 to DCA3 which is a specific area so that the density of the contact hole CH may vary in the third area of the bezel area BA. Further, in order to improve the luminance difference generated between the pixels P due to the density difference of the contact holes CH disposed in the third area of the bezel area BA, a dummy hole may be further disposed in the third area of the bezel area BA. In the present disclosure, the dummy hole may be disposed in the third area of the bezel area BA adjacent to the curved portion RO having a round shape of the active area AA. The dummy hole is disposed in the bezel area BA adjacent to the curved portion RO of the active area AA to reduce the luminance nonuniformity generated in the display panel 10 due to the density nonuniformity of the hole.

The exemplary embodiments of the present disclosure can also be described as follows:

According to an aspect of the present disclosure, there is provided a display apparatus. The display apparatus includes an active area including a first area having a free form portion and a second area which does not have a free form portion and a bezel area including a third area which is adjacent to the first area and has a free form portion and a fourth area which is adjacent to the second area and does not have a free form portion, the display apparatus comprising: a plurality of semiconductor patterns disposed in the third area of the bezel area, an insulating layer which is disposed on the plurality of semiconductor patterns, is made of a plurality of layers, and includes a plurality of contact holes and a plurality of dummy holes, a power supply electrode which is disposed in the third area of the bezel area, overlaps the semiconductor patterns with the insulating layer therebetween, and is connected to the plurality of semiconductor patterns through the plurality of contact holes of the insulating layer, a plurality of dummy gate lines which is disposed between the semiconductor patterns and the power supply electrode, overlaps the semiconductor pattern to form a first compensation capacitance and overlaps the power supply electrode to form a second compensation capacitance, and a plurality of dummy semiconductor patterns which is disposed in the third area of the bezel area adjacent to a curved portion having a round shape in the first area of the active area and have a smaller area than that of the plurality of semiconductor patterns, and is connected to the power supply electrode through the plurality of dummy holes of the insulting layer.

The first area of the active area may include a 1a-th area including the curved portion and a notch portion in which one side is removed and a 1b-th area including only the curved portion, and The third area of the bezel area may include a 3a-th area adjacent to the 1a-th area and a 3b-th area adjacent to the 1b-th area.

The 1a-th area including the notch portion may include first and second sub active areas divided to the left and the right by the notch portion.

The display apparatus may further include a 1a-th gate line and a 2a-th gate line disposed in the first sub active area, and a 1b-th gate line and a 2b-th gate line disposed in the second sub active area.

The plurality of dummy gate lines may include a first dummy gate line and a second dummy gate line and the first dummy gate line and the second dummy gate line may be disposed in the third area of the bezel area disposed between the first sub active area and the second sub active area.

The first dummy gate line may be connected to the 1a-th gate line disposed in the first sub active area and the 1b-th gate line disposed in the second sub active area and the second dummy gate line may be connected to the 2a-th gate line disposed in the first sub active area and the 2b-th gate line disposed in the second sub active area.

One of the plurality of semiconductor patterns may overlap at least two contact holes of the plurality of contact holes and the plurality of dummy semiconductor patterns overlaps the plurality of dummy holes, respectively.

According to another aspect of the present disclosure, there is provided a display apparatus. The display apparatus includes a substrate including an active area which includes a curved portion having a round shape, a notch portion in which one side is removed, and first and second sub active areas which display a screen and is divided to the left and the right by the notch portion and a bezel area disposed to be adjacent to the active area, a plurality of semiconductor patterns of a compensating unit disposed in the bezel area located between the first sub active area and the second sub active area, a plurality of first dummy semiconductor patterns of a first dummy contact unit disposed between the first sub active area and the compensating unit and a plurality of second dummy semiconductor patterns of a second dummy contact unit disposed between the second sub active area and the compensating unit, the plurality of first dummy semiconductor patterns and the plurality of second dummy semiconductor patterns being disposed in the bezel area adjacent to the curved portion, a power supply line which overlaps the plurality of semiconductor patterns, the plurality of first dummy semiconductor patterns, and the plurality of second dummy semiconductor patterns with an insulating layer therebetween, and a first dummy gate line and a second dummy gate line which overlap the plurality of semiconductor patterns and the power supply line and do not overlap the plurality of first dummy semiconductor patterns and the plurality of second dummy semiconductor patterns.

The first dummy gate line and the second dummy line may be disposed in the bezel area located between the first sub active area and the second sub active area.

Areas of the plurality of first dummy semiconductor patterns and the plurality of second dummy semiconductor patterns may be smaller than those of the plurality of semiconductor patterns.

The insulating layer may include a plurality of contact holes which exposes the plurality of semiconductor patterns, a plurality of first dummy holes which exposes the plurality of first dummy semiconductor patterns, and a plurality of second dummy holes which expose the plurality of second dummy semiconductor patterns.

The power supply line may be connected to the plurality of semiconductor patterns through the plurality of contact holes, the power supply line may be connected to the plurality of first dummy semiconductor patterns through the plurality of first dummy holes, and the power supply line may be connected to the plurality of second dummy semiconductor patterns through the plurality of second dummy holes.

Each of the plurality of semiconductor patterns may overlap at least two of the plurality of contact holes, the plurality of first dummy semiconductor patterns may overlap the plurality of first dummy holes with one-to-one correspondence, and the plurality of second dummy semiconductor patterns may overlap the plurality of second dummy holes with one-to-one correspondence.

According to still another aspect of the present disclosure, there is provided a display apparatus. The display apparatus includes a substrate including an active area including a first area having a free form portion and a second area which does not have a free form portion and a bezel area including a third area which is adjacent to the first area and has a free form portion and a fourth area which is adjacent to the second area and does not have a free form portion, a plurality of semiconductor patterns which is located on the substrate and is disposed in the third area of the bezel area, a plurality of dummy semiconductor patterns which is disposed on the same layer as the plurality of semiconductor patterns and has a smaller area than that of the plurality of semiconductor patterns, a gate insulating layer on the plurality of semiconductor patterns and the plurality of dummy semiconductor patterns, a first interlayer insulating layer on the gate insulating layer, a plurality of dummy gate lines on the first interlayer insulating layer, a second interlayer insulating layer which is disposed on the first interlayer insulating layer and covers the plurality of dummy gate lines, and a power supply line which is disposed on the second interlayer insulating layer and overlaps the plurality of dummy gate lines to form a first compensation capacitance.

The plurality of dummy gate lines may overlap the plurality of semiconductor patterns with the gate insulating layer and the first interlayer insulating layer therebetween to form a second compensation capacitance, and the plurality of dummy gate lines may not overlap the plurality of dummy semiconductor patterns.

The gate insulating layer, the first interlayer insulating layer, and the second interlayer insulating layer may include a plurality of contact holes which exposes the plurality of semiconductor patterns and a plurality of dummy holes which exposes the plurality of dummy semiconductor patterns, and the power supply line may be connected to the semiconductor patterns through the plurality of contact holes and may be connected to the dummy semiconductor patterns through the plurality of dummy holes.

The plurality of dummy semiconductor patterns may be disposed in the third area of the bezel area adjacent to the curved portion having a round shape in the first area of the active area.

Each of the plurality of semiconductor patterns may overlap at least two contact holes and the plurality of dummy semiconductor patterns may overlap the plurality of dummy holes with one-to-one correspondence.

The first area of the active area may include a notch portion in which one side is removed and the first area of the active area may include first and second sub active areas divided to the left and the right by the notch portion.

The plurality of semiconductor patterns may be disposed in the third area of the bezel area located between the first sub active area and the second sub active area and the plurality of dummy semiconductor patterns may be disposed in the third area of the bezel area located between the plurality of semiconductor patterns and the first sub active area and between the plurality of semiconductor patterns and the second sub active area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus including an active area, the active area including a first area having a free form portion and a second area which does not have a free form portion, and a bezel area, the bezel area including a third area which is adjacent to the first area and has a free form portion and a fourth area which is adjacent to the second area and does not have a free form portion, the display apparatus comprising:
    a plurality of semiconductor patterns disposed in the third area of the bezel area;
    an insulating layer disposed on the plurality of semiconductor patterns, the insulating layer made of a plurality of layers;
    a power supply electrode disposed in the third area of the bezel area, the power supply electrode overlapping the plurality of semiconductor patterns with the insulating layer therebetween;
    a plurality of dummy gate lines disposed between the plurality of semiconductor patterns and the power supply electrode, the plurality of dummy gate lines overlapping the plurality of semiconductor patterns to form a first compensation capacitance and overlapping the power supply electrode to form a second compensation capacitance; and
    a plurality of dummy semiconductor patterns disposed in the third area of the bezel area, wherein the plurality of layers includes a gate insulating layer on the plurality of semiconductor patterns and the plurality of dummy semiconductor patterns, a first interlayer insulating layer on the gate insulating layer, and a second interlayer insulating layer on the first interlayer insulating layer,
    wherein the gate insulating layer, the first interlayer insulating layer, and the second interlayer insulating layer include a plurality of contact holes which expose the plurality of semiconductor patterns and a plurality of dummy holes which expose the plurality of dummy semiconductor patterns, and
    wherein the power supply electrode is connected to the plurality of semiconductor patterns through the plurality of contact holes and is connected to the plurality of dummy semiconductor patterns through the plurality of dummy holes.

2. The display apparatus according to claim 1, wherein each of the plurality of dummy semiconductor patterns has a smaller area than that of each of the plurality of semiconductor patterns.

3. The display apparatus according to claim 1, wherein the plurality of dummy semiconductor patterns includes at least one dummy semiconductor pattern disposed in the third area of the bezel area adjacent to a curved portion having a round shape in the first area of the active area.

4. The display apparatus according to claim 1, wherein the first area of the active area includes a fifth area including a curved portion having a round shape and a notch portion in which one side is removed and a sixth area including only the curved portion, and
    the third area of the bezel area includes a seventh area adjacent to the fifth area and an eighth area adjacent to the sixth area.

5. The display apparatus according to claim 4, wherein the fifth area including the notch portion includes a first sub active area and a second sub active area divided to a left and a right by the notch portion.

6. The display apparatus according to claim 5, further comprising:
    a first gate line and a second gate line disposed in the first sub active area; and
    a third gate line and a fourth gate line disposed in the second sub active area.

7. The display apparatus according to claim 6, wherein the plurality of dummy gate lines include a first dummy gate line and a second dummy gate line, and the first dummy gate line and the second dummy gate line are disposed in the third area of the bezel area disposed between the first sub active area and the second sub active area.

8. The display apparatus according to claim 7, wherein the first dummy gate line is connected to the first gate line disposed in the first sub active area and the third gate line disposed in the second sub active area, and the second dummy gate line is connected to the second gate line disposed in the first sub active area and the fourth gate line disposed in the second sub active area.

9. The display apparatus according to claim 1, wherein one of the plurality of semiconductor patterns overlaps at least two contact holes of the plurality of contact holes and the plurality of dummy semiconductor patterns overlaps the plurality of dummy holes.

10. A display apparatus comprising:
    a substrate including an active area which includes a notch portion in which one side is removed, and a first sub active area and a second sub active area which display a screen and are divided to a left and a right by the notch portion and a bezel area disposed to be adjacent to the active area;
    a plurality of semiconductor patterns of a compensating unit disposed in the bezel area located between the first sub active area and the second sub active area;
    a plurality of first dummy semiconductor patterns of a first dummy contact unit disposed between the first sub active area and the compensating unit;

a plurality of second dummy semiconductor patterns of a second dummy contact unit disposed between the second sub active area and the compensating unit;

a power supply line which overlaps the plurality of semiconductor patterns, the plurality of first dummy semiconductor patterns, and the plurality of second dummy semiconductor patterns with an insulating layer therebetween; and at least one dummy gate line which overlaps the plurality of semiconductor patterns and the power supply line and does not overlap the plurality of first dummy semiconductor patterns and the plurality of second dummy semiconductor patterns.

11. The display apparatus according to claim 10, wherein the plurality of first dummy semiconductor patterns and the plurality of second dummy semiconductor patterns are disposed adjacent to the notch portion.

12. The display apparatus according to claim 10, wherein the at least one dummy gate line is disposed in the bezel area located between the first sub active area and the second sub active area.

13. The display apparatus according to claim 10, wherein each of the plurality of first dummy semiconductor patterns and each of the plurality of second dummy semiconductor patterns have a smaller area than that of each of the plurality of semiconductor patterns.

14. The display apparatus according to claim 10, wherein the insulating layer includes a plurality of contact holes which expose the plurality of semiconductor patterns, a plurality of first dummy holes which expose the plurality of first dummy semiconductor patterns, and a plurality of second dummy holes which expose the plurality of second dummy semiconductor patterns.

15. The display apparatus according to claim 14, wherein the power supply line is connected to the plurality of semiconductor patterns through the plurality of contact holes, wherein the power supply line is connected to the plurality of first dummy semiconductor patterns through the plurality of first dummy holes, and wherein the power supply line is connected to the plurality of second dummy semiconductor patterns through the plurality of second dummy holes.

16. The display apparatus according to claim 14, wherein each of the plurality of semiconductor patterns overlaps at least two of the plurality of contact holes, the plurality of first dummy semiconductor patterns overlap the plurality of first dummy holes with one-to-one correspondence, and the plurality of second dummy semiconductor patterns overlap the plurality of second dummy holes with one-to-one correspondence.

17. A display apparatus, comprising:
a substrate including an active area including a first area having a free form portion, a second area which does not have a free form portion, a bezel area including a third area which is adjacent to the first area and has a free form portion, and a fourth area which is adjacent to the second area and does not have a free form portion;
a plurality of semiconductor patterns which are located on the substrate and are disposed in the third area of the bezel area;
a plurality of dummy semiconductor patterns which are disposed on a same layer as the plurality of semiconductor patterns;

a gate insulating layer on the plurality of semiconductor patterns and the plurality of dummy semiconductor patterns;
a first interlayer insulating layer on the gate insulating layer;
a plurality of dummy gate lines on the first interlayer insulating layer;
a second interlayer insulating layer disposed on the first interlayer insulating layer, the second interlayer insulating layer covering the plurality of dummy gate lines; and
a power supply line disposed on the second interlayer insulating layer, the power supply line overlapping the plurality of dummy gate lines to form a first compensation capacitance,
wherein the gate insulating layer, the first interlayer insulating layer, and the second interlayer insulating layer include a plurality of contact holes which expose the plurality of semiconductor patterns and a plurality of dummy holes which expose the plurality of dummy semiconductor patterns, and
wherein the power supply electrode is connected to the plurality of semiconductor patterns through the plurality of contact holes and is connected to the plurality of dummy semiconductor patterns through the plurality of dummy holes.

18. The display apparatus according to claim 17, wherein each of the plurality of dummy semiconductor patterns has a smaller area than that of each of the plurality of semiconductor patterns.

19. The display apparatus according to claim 17, wherein the plurality of dummy gate lines overlap the plurality of semiconductor patterns with the gate insulating layer and the first interlayer insulating layer therebetween to form a second compensation capacitance, and the plurality of dummy gate lines do not overlap the plurality of dummy semiconductor patterns.

20. The display apparatus according to claim 17, wherein the plurality of dummy semiconductor patterns are disposed in the third area of the bezel area adjacent to a curved portion having a round shape in the first area of the active area.

21. The display apparatus according to claim 19, wherein each of the plurality of semiconductor patterns overlaps at least two contact holes and the plurality of dummy semiconductor patterns overlap the plurality of dummy holes with one-to-one correspondence.

22. The display apparatus according to claim 17, wherein the first area of the active area includes a notch portion in which one side is removed, and the first area of the active area includes a first sub active area and a second sub active area divided to a left and a right by the notch portion.

23. The display apparatus according to claim 22, wherein the plurality of semiconductor patterns are disposed in the third area of the bezel area located between the first sub active area, and the second sub active area and the plurality of dummy semiconductor patterns are disposed in the third area of the bezel area located between the plurality of semiconductor patterns and the first sub active area and between the plurality of semiconductor patterns and the second sub active area.

* * * * *